(12) United States Patent
Chen et al.

(10) Patent No.: US 11,817,426 B2
(45) Date of Patent: Nov. 14, 2023

(54) PACKAGE AND METHOD OF FABRICATING THE SAME

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 91 days.

(21) Appl. No.: 17/337,594

(22) Filed: Jun. 3, 2021

(65) Prior Publication Data

US 2022/0223565 A1 Jul. 14, 2022

Related U.S. Application Data

(60) Provisional application No. 63/136,776, filed on Jan. 13, 2021.

(51) Int. Cl.
| | | |
|---|---|---|
| *H01L 25/065* | (2023.01) | |
| *H01L 23/00* | (2006.01) | |
| *H01L 25/00* | (2006.01) | |

(52) U.S. Cl.
CPC .......... *H01L 25/0657* (2013.01); *H01L 24/08* (2013.01); *H01L 24/80* (2013.01); *H01L 25/50* (2013.01); *H01L 2224/08146* (2013.01); *H01L 2224/80895* (2013.01); *H01L 2224/80896* (2013.01); *H01L 2225/06541* (2013.01); *H01L 2225/06582* (2013.01)

(58) Field of Classification Search
CPC ..... H01L 25/0657; H01L 24/08; H01L 24/80; H01L 25/05
See application file for complete search history.

(56) References Cited

U.S. PATENT DOCUMENTS

| | | |
|---|---|---|
| 2014/0217604 A1 | 8/2014 | Chou et al. |
| 2019/0131276 A1 | 5/2019 | Chen et al. |

(Continued)

FOREIGN PATENT DOCUMENTS

| | | |
|---|---|---|
| KR | 20120057289 A | 6/2012 |
| KR | 101390877 B1 | 4/2014 |
| KR | 101759770 B1 | 7/2017 |

(Continued)

*Primary Examiner* — Trang Q Tran
(74) *Attorney, Agent, or Firm* — Slater Matsil, LLP

(57) ABSTRACT

Packages and methods of fabricating the same are provided. The package includes a first die, wherein the first die includes a plurality of through vias from a first surface of the first die toward a second surface of the first die; a second die disposed below the first die, wherein the second surface of the first die is bonded to the second die; an isolation layer disposed in the first die, wherein the plurality of through vias extend through the isolation layer; an encapsulation laterally surrounding the first die, wherein the encapsulation is laterally separated from the isolation layer; a buffer layer disposed over the first die, the isolation layer, and the encapsulation; and a plurality of conductive terminals disposed over the isolation layer, wherein the plurality of conductive terminals is electrically connected to corresponding ones of the plurality of through vias.

20 Claims, 42 Drawing Sheets

(56) References Cited

U.S. PATENT DOCUMENTS

2019/0148250 A1* 5/2019 Yu .......................... H01L 21/56
                                                        257/773
2020/0335512 A1  10/2020 Nishikawa et al.

FOREIGN PATENT DOCUMENTS

| KR | 20190055692 A | 5/2019 |
| TW | 201911519 A | 3/2019 |
| TW | 201919193 A | 5/2019 |

* cited by examiner

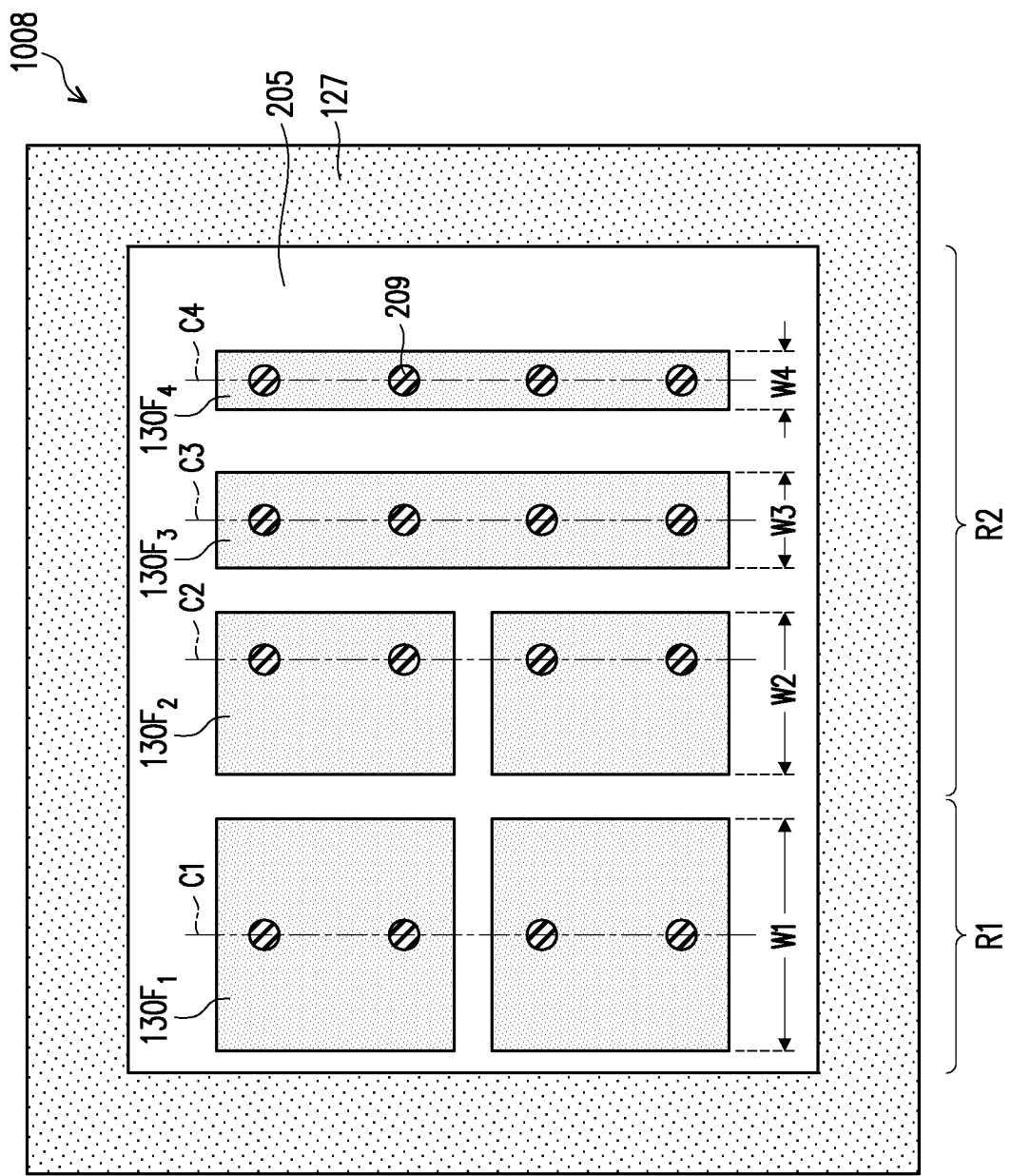

PACKAGE AND METHOD OF FABRICATING THE SAME

PRIORITY

This application claims the benefit of U.S. Provisional Application No. 63/136,776 filed on Jan. 13, 2021, entitled "Package and Method of Fabricating the Same," which application is hereby incorporated by reference.

BACKGROUND

The packages of integrated circuits are becoming increasing complex, with more device dies packaged in the same package to achieve more functions. For example, System on Integrate Chip (SoIC) has been developed to include a plurality of device dies such as processors and memory cubes in the same package. The SoIC may include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
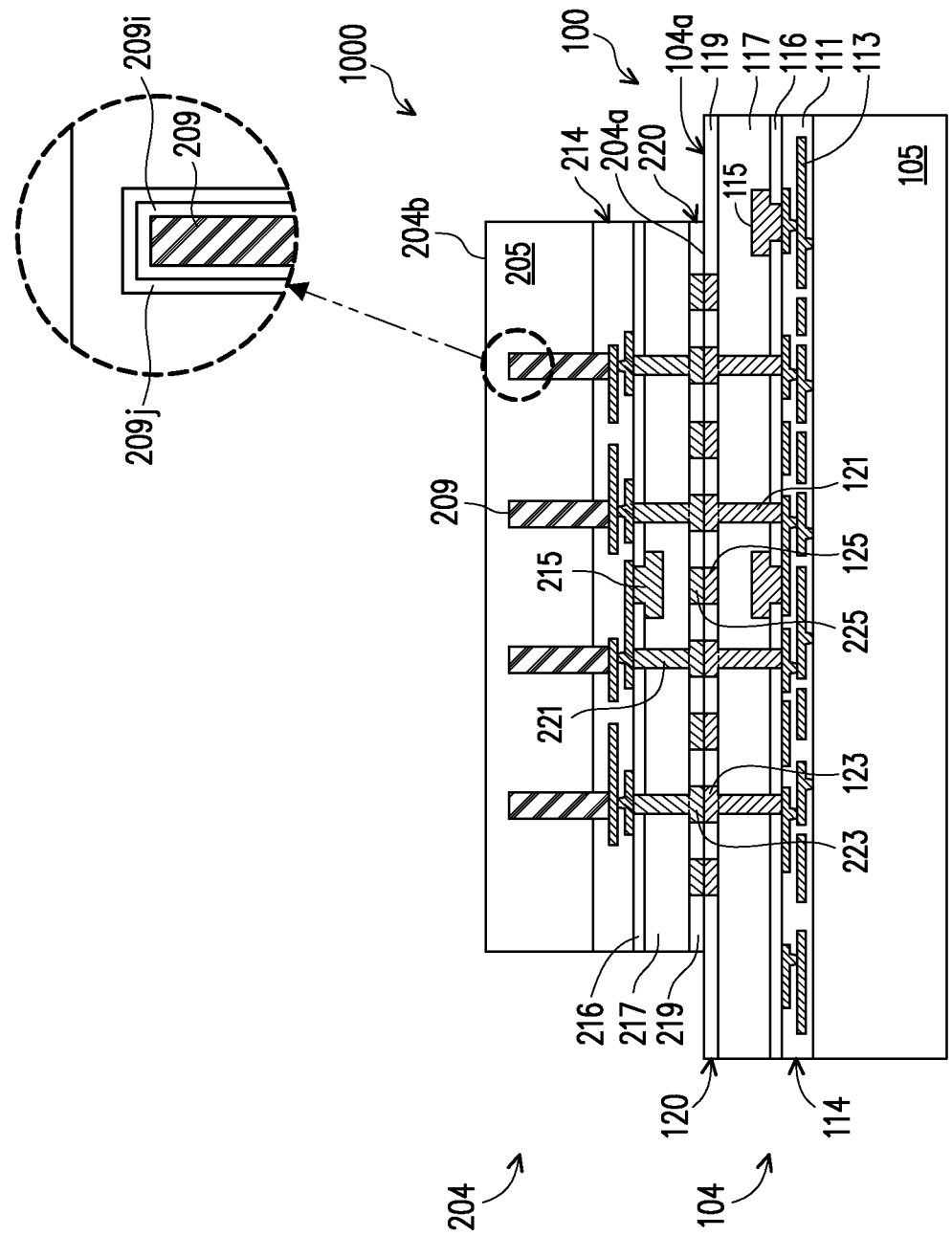
FIG. 1A to FIG. 1J are schematic cross-sectional views illustrating a method of forming a 3DIC structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

A package structure and the method of forming the same are provided in accordance with various embodiments. In some embodiments, the package structure is a System on Integrated Chip (SoIC) package. The intermediate stages of forming the SoIC package are illustrated in accordance with some embodiments. Throughout the various views and illustrative embodiments, like reference numbers are used to designate like elements. It is appreciated that although the formation of SoIC packages is used as examples to explain the concept of the embodiments of the present disclosure, the embodiments of the present disclosure are readily applicable to other package structures and packaging methods in which the a surface of an encapsulation surrounding a top die is covered to prevent/reduce etching of the encapsulation. Therefore, the top surface of the encapsulation may be protected from pit defects and chamber contamination may be reduced during through substrate vias (TSVs) of the top die are revealed.

Figure 14:
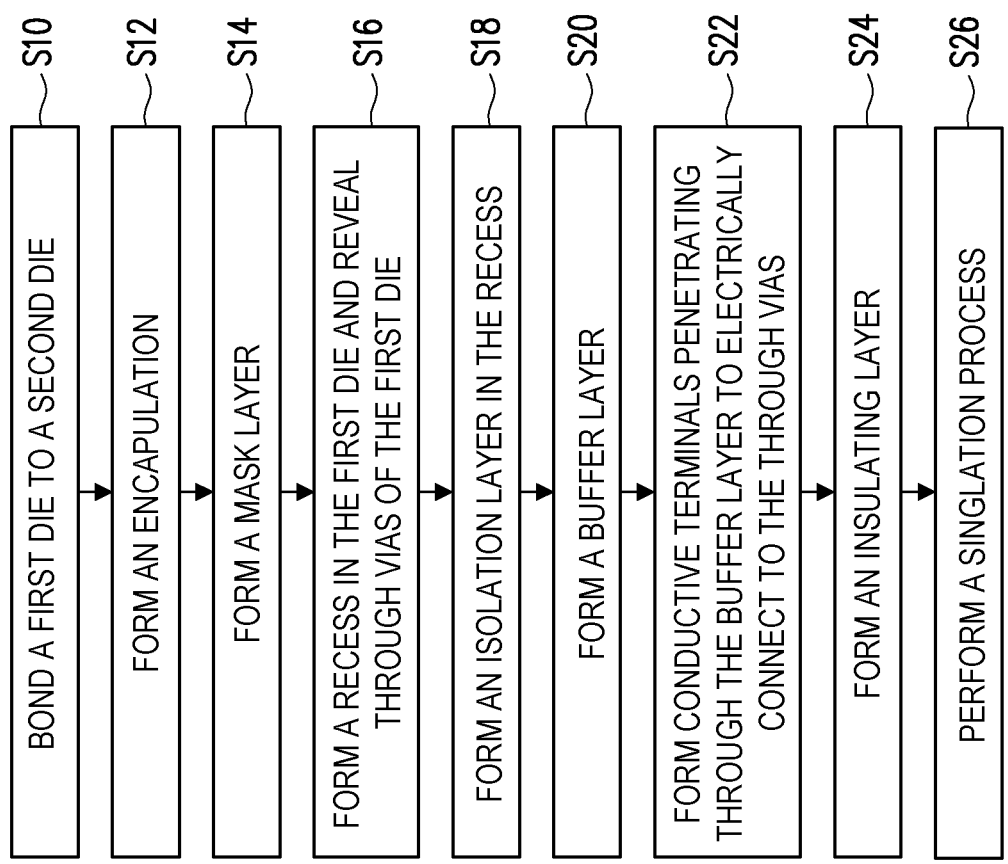
FIG. 14 illustrates a process flow for forming a 3DIC structure 111 accordance with some embodiments.

FIG. 1A to FIG. 1J are schematic cross-sectional views illustrating a method of forming a 3DIC structure according to some embodiments of the disclosure. FIG. 2A is a top view of FIG. 1G. FIG. 2B is an enlarge view of a region in FIG. 2A. FIG. 2C is a schematic cross-sectional view of FIG. 2B. FIG. 1A to FIG. 1J are also reflected schematically in the process flow shown in FIG. 14.

Figure 1B:
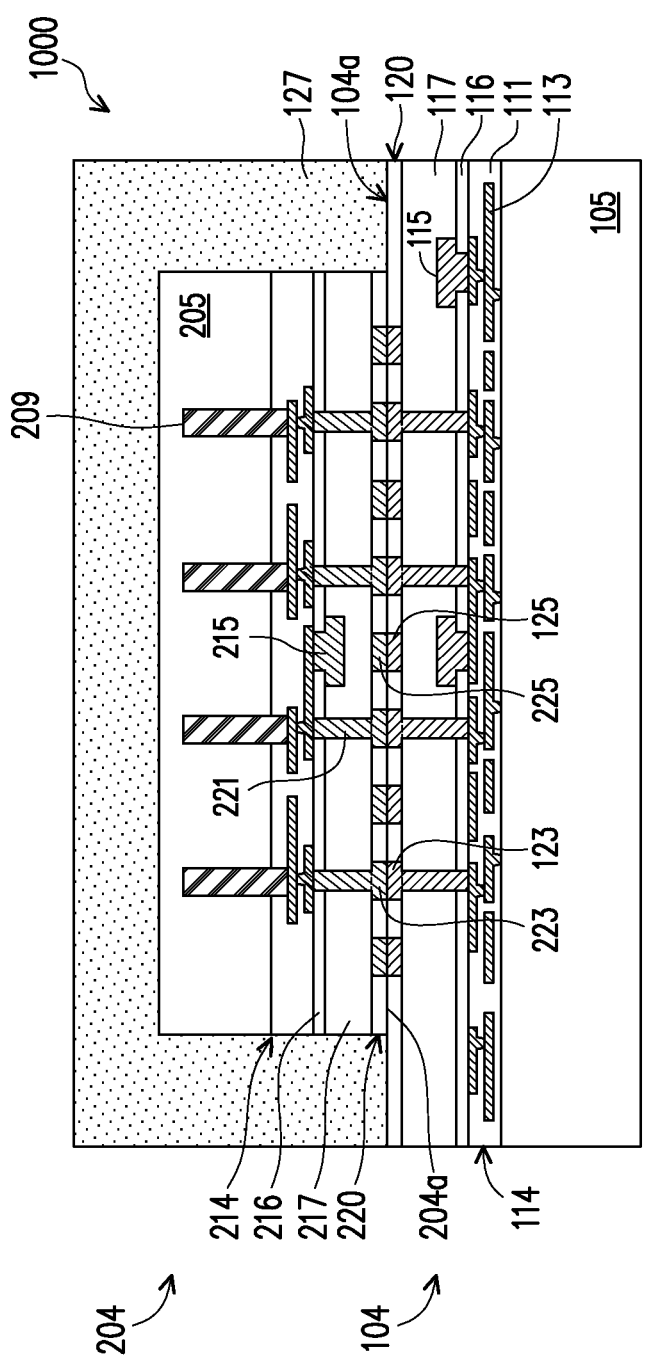
Figure 1C:
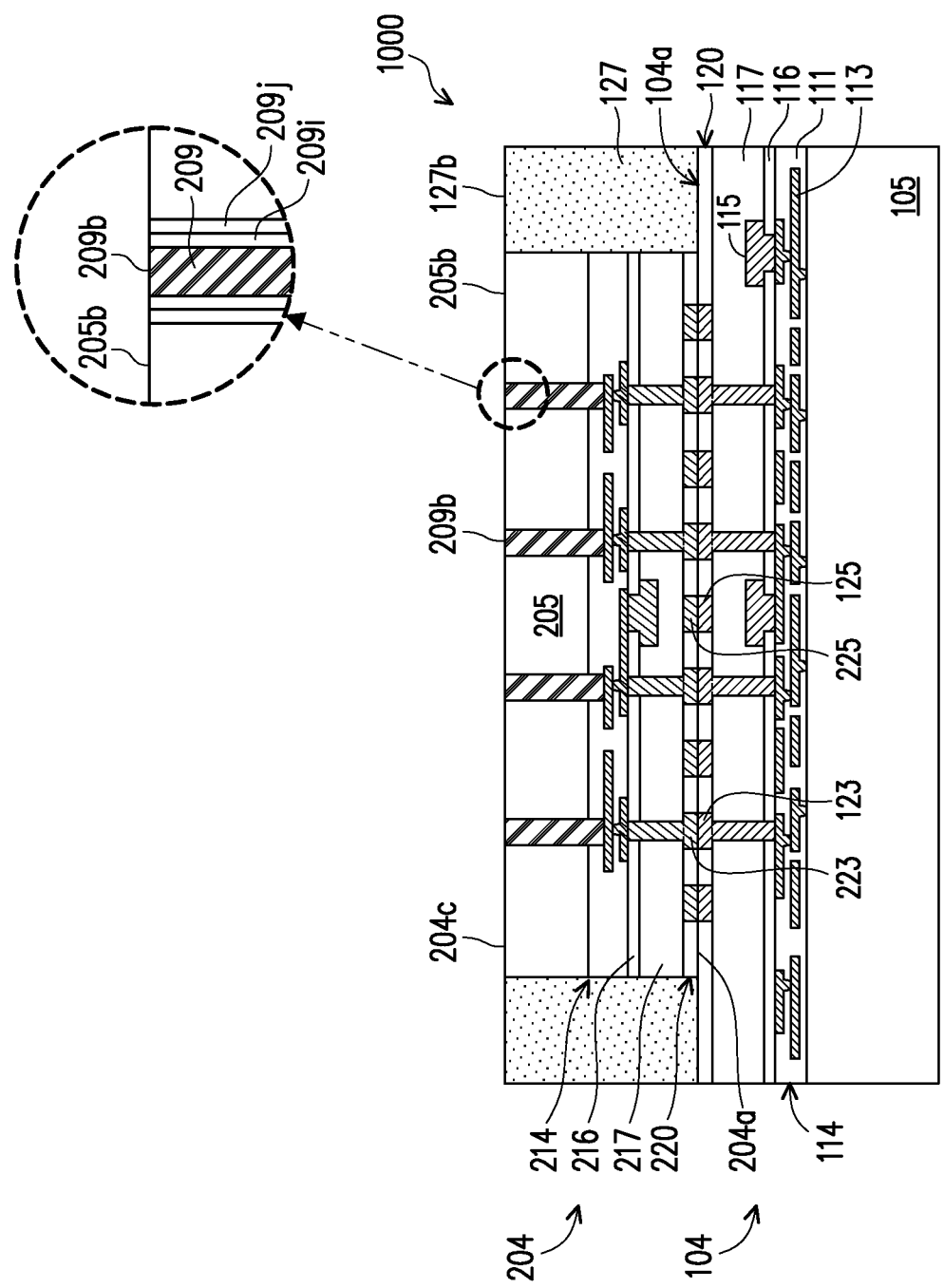
Figure 2A:
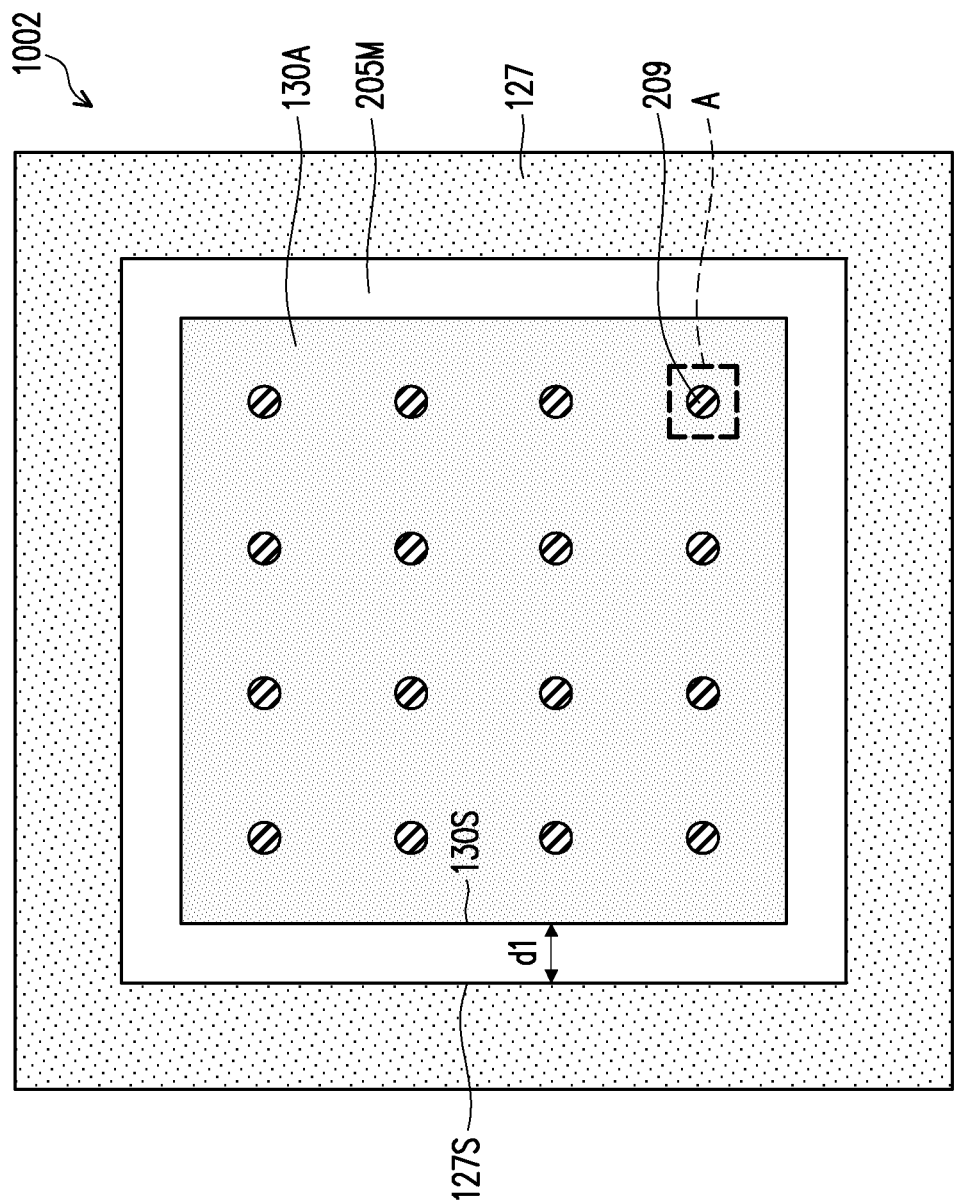
FIG. 2A to FIG. 12 are schematic various views illustrating 3DIC structures according to some embodiments of the disclosure.
Figure 2C:
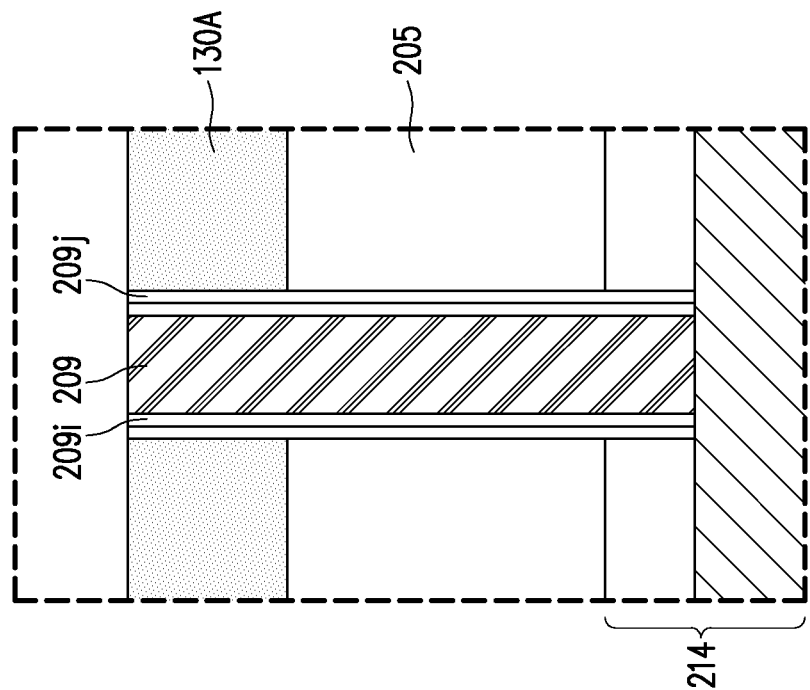
Figure 2B:
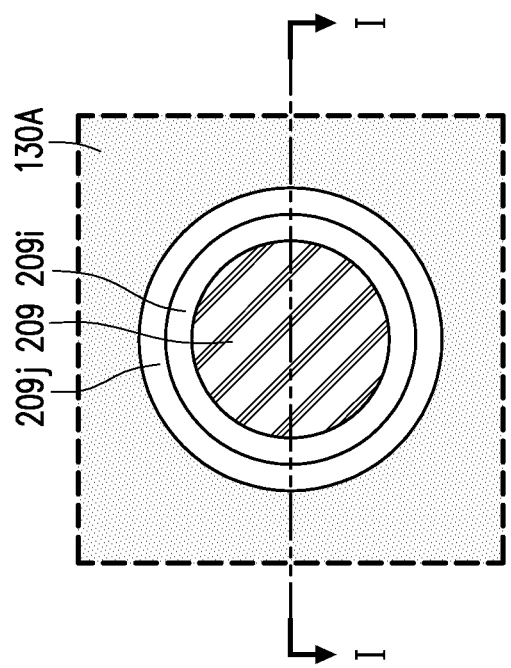

FIG. 1A through FIG. 1C illustrate a die 204 bonded to a wafer 100 and laterally encapsulating by an encapsulation 127.

Referring to FIG. 1A, the wafer 100 having a plurality of dies 104 is provided. In accordance with some embodiments of the present disclosure, the dies 104 include IC dies, and may be logic dies (e.g., central processing unit, graphics processing unit, system-on-a-chip, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 104 may be different sizes (e.g., different heights and/or surface areas), and in other embodiments, the dies 104 may be the same size (e.g., same heights and/or surface areas).

The wafer 100 includes a substrate 105 and a bonding structure 120 over the substrate 105. In some embodiments, the substrate 105 may be formed of silicon, although it may also be formed of other group III, group IV, and/or group V elements or compounds, such as silicon, germanium, gallium, arsenic, and combinations thereof. The substrate 105 may also be in the form of silicon-on-insulator (SOI). The SOI substrate may include a layer of a semiconductor material (e.g., silicon, germanium and/or the like) formed over an insulator layer (e.g., buried oxide and/or the like), which is formed on a semiconductor (such as silicon) substrate. In addition, other substrates that may be used include multi-layered substrates, gradient substrates, hybrid orientation substrates, any combinations thereof and/or the like.

The wafer 100 may further include one or more integrated circuit devices, an interconnection structure 114, contact pads 115, a passivation layer 116, and a dielectric layer 117 between the substrate 105 and the bonding structure 120. The integrated circuit devices may include active and/or passive devices. The one or more active and/or passive devices may be formed on and/or in the substrate 105. In some embodiments, the one or more active and/or passive devices may include various n-type metal-oxide semiconductor (NMOS) and/or p-type metal-oxide semiconductor (PMOS) devices such as transistors, capacitors, resistors, diodes, photo-diodes, fuses and/or the like. The interconnection structure 114 is formed over the substrate 105 and the one or more active and/or passive devices. The interconnection structure 114 may provide electrical connections between the one or more integrated circuit devices formed on the substrate 105. The interconnection structure 114 may include a metallization structure 113 formed in a dielectric structure 111.

The dielectric structure 111 may include a plurality of dielectric layers, such as inter-layer dielectric layers (ILDs) and inter-metal dielectric layers (IMDs). In some embodiments, the dielectric structure 111 comprises one or more layers of inorganic and/or organic dielectric material. For example, the material of the dielectric structure 111 may include one or more layers of silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), SiOxCy, Spin-On-Glass, Spin-On-Polymers, silicon carbon material, compounds thereof, composites thereof, combinations thereof, or the like.

The metallization structure 113 includes a plurality of conductive features interconnected to each other and embedded in the dielectric structure 111. The conductive features may include multi-layers of conductive lines, conductive vias, and conductive contacts. The conductive contacts may be formed in the ILDs to electrically connect the conductive lines to the devices; the conductive vias may be formed in the IMDs to electrically connect the conductive lines in different layers. The conductive features of the metallization structure 113 may include metal, metal alloy or a combination thereof. For example, the conductive features may include tungsten (W), copper (Cu), copper alloys, aluminum (Al), aluminum alloys, or combinations thereof. In some embodiments, the topmost conductive features of the metallization structure 113 have top surfaces substantially coplanar with a top surface of the dielectric structure 111, but the disclosure is not limited thereto.

In some embodiments, the passivation layer 116 is formed on the interconnection structure 114 to cover the dielectric structure 111 and the metallization structure 113. The passivation layer 116 may include a dielectric material such as silicon oxide, silicon nitride, silicon oxynitride, or combinations thereof. In an embodiment, the material of the passivation layer 116 is different from an underlying dielectric layer of the dielectric structure 111. For example, the topmost dielectric layer of the dielectric structure 111 includes silicon oxide, while the passivation layer 116 includes silicon nitride. However, the disclosure is not limited thereto.

The contact pads 115 are formed over the interconnection structure 114. The contact pads 115 are formed on and penetrating through the passivation layer 116 to electrically connect to a top conductive feature of the interconnection structure 114, and may be electrically coupled to the one or more active and/or passive devices through the metallization structure 113. In some embodiments, the contact pads 115 may include a conductive material such as aluminum, copper, tungsten, silver, gold, a combination thereof, or the like.

The dielectric layer 117 is formed over the interconnection structure 114 and the contact pads 115. In some embodiments, the dielectric layer 117 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like. In other embodiments, the dielectric layer may include one or more layers of photo-patternable insulating materials such as polybenzoxazole (PBO), polyimide (PI), benzocyclobutene (BCB), a combination thereof, or the like. In some embodiments, the dielectric layer is planarized using a CMP process, a grinding process, an etching process, a combination thereof, or the like.

Referring to FIG. 1A, the bonding structure 120 is formed on the dielectric layer 117. The bonding structure 120 includes an insulating layer 119 formed on the dielectric layer 117 and the bond pads 123 formed in the insulating layers 119. In some embodiments, the bonding structure 120 further includes dummy pads 125 formed in the insulating layer 119. In some embodiments, the bond pads 123 are in direct electrical contact with vias 121 formed in the dielectric layer 117 and penetrating through the passivation layer 116 to electrically connect to the topmost conductive features of the metallization structure 113. In alternative embodiments, the bond pads 123 are in direct electrical contact with vias (not shown) landing on the contact pad 115.

In some embodiments, the insulating layer 119 includes one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In some embodiments, the insulating layer 119 is planarized using a CMP process, a grinding process, an etching process, a combination thereof, or the like. In some embodiments, the insulating layer 119 and the underlying dielectric layer may include a same material. In other embodiments, the insulating layer 119 and the underlying dielectric layer may include different materials.

In some embodiments, the bond pads 123, dummy pads 125 and the vias 121 may include a conductive material such as aluminum, copper, tungsten, silver, gold, a combination thereof, or the like. In some embodiments, a conductive material may be formed over the interconnection structure using, for example, PVD, ALD, electro-chemical plating, electroless plating, a combination thereof, or the like. Subsequently, the conductive material is patterned to form the contact pads using suitable photolithography and etching methods. The bond pads 123, dummy pads 125 and the vias 121 may be formed in the insulating layer 119 using, for example, a damascene process, a dual damascene process, a combination thereof, or the like. In some embodiments, the bond pads 123, the dummy pads 125 and the insulating layer 119 are planarized, such that topmost surfaces of the bond pads 123 and the dummy pads 125 are substantially level or coplanar with a topmost surface of the insulating layer 119.

Referring to FIG. 1A, the die 204 is bonded to the die 104 on the first side of the wafer 100 to start forming a wafer-level die structure moo. The respective process is illustrated as step S10 in the process flow shown in FIG. 14. The die 204 may be a die which has been singulated from another semiconductor wafer. Although one die 104 and one die 204 are shown in the figures, the number of the die 104 and 204 are not limited in the disclosure.

The die 204 and the die 104 may be the same types of dies or different types of dies, and the types of the dies are not limited in the disclosure. The die 204 may be a logic die (e.g., central processing unit, graphics processing unit, system-on-a-chip, microcontroller, etc.), a memory die (e.g., dynamic random access memory (DRAM) die, static random access memory (SRAM) die, etc.), power management dies (e.g., power management integrated circuit (PMIC) die), a radio frequency (RF) die, a sensor dies, microelectro-mechanical-system (MEMS) die, a signal processing die (e.g., digital signal processing (DSP) die), a front-end die (e.g., analog front-end (AFE) die), the like, or a combination thereof. Also, in some embodiments in which a plurality of dies 204 are bonded to the wafer 100, the dies 204 may be different sizes (e.g., different heights and/or surface areas), and in other embodiments, the dies 204 may be the same size (e.g., same heights and/or surface areas).

The die 204 may include substrate 205, one or more active and/or passive devices (not shown), and interconnection structure 214, contact pads 215, a dielectric layer 217, vias 221, and a bonding structure 220. The bonding structure 220 includes bond pads 223, dummy pads 225 and an insulating layer 219. In some embodiments, the material and the formation method of the substrate 205, the interconnection structure 214, the contact pads 215, the dielectric layer 217, the vias 221, and the bonding structure 220 of the die 204 may be similar to the substrate 105, the interconnection structure 114, the contact pads 115, the dielectric layer 117, the vias 121 and the bonding structure 120 of the wafer 100, and hence the details are not repeated herein.

In some embodiments, the die 204 further include conductive vias 209 formed in the substrate 205 and electrically connected to the interconnection structure 214. In some embodiments, the conductive vias 209 may be arranged as an array, a plurality of arrays, irregularly, or a combination thereof. The conductive vias 209 may extend into the interconnection structure 214 to be in physical and electrical contact with the conductive features of the interconnection structure 214. In some embodiments, the conductive vias 209 are be formed by forming openings in the substrate 205 and filling the openings with suitable conductive materials. In some embodiments, the openings may be formed using suitable photolithography and etching methods. The openings may be filled with copper, a copper alloy, silver, gold, tungsten, tantalum, aluminum, aluminum alloys, a combination thereof, or the like, using physical vapor deposition (PVD), atomic layer deposition (ALD), electro-chemical plating, electroless plating, or a combination thereof, the like. In some embodiments, a liner 209j and/or an adhesive layer 209i may be formed in the openings before filling the openings with the suitable conductive materials. The liner 209j may include dielectric material, such as silicon oxide, silicon nitride, silicon oxynitride or the like, or combinations thereof. The adhesive layer 209i may include Ta, TaN, Ti, TiN, or combinations thereof.

Various suitable bonding techniques may be applied for the bonding of the die 204 to the wafer 100. For example, the die 204 may be bonded to the wafer 100 through hybrid bonding, fusion bonding, or the like, or combinations thereof. For example, the bonding of the die 204 to the wafer 100 may be achieved through hybrid bonding involving at least two types of bonding, including metal-to-metal bonding and non-metal-to-non-metal bonding such as dielectric-to-dielectric bonding, for example. In some embodiments, the bond pads 223 are bonded to the bond pads 123 of the die (or referred to as bottom die) 104, and the dummy pads 225 are bonded to the dummy pads 125 of the die 104 through metal-to-metal direct bonding. In accordance with some embodiments of the present disclosure, the metal-to-metal direct bonding is copper-to-copper direct bonding. The bond pads 223 may have sizes greater than, equal to, or smaller than the sizes of the respective the bond pads 123. The dummy pads 225 may have sizes greater than, equal to, or smaller than, the sizes of the respective dummy pads 125. Furthermore, the insulating layer 219 may be bonded to the insulating layer 119 through dielectric-to-dielectric bonding, which may be fusion bonding, for example, with Si—O—Si bonds generated.

In some embodiments, the bonding process may be performed as discussed below. First, to avoid the occurrence of the unbonded areas (e.g. interface bubbles), the to-be-bonded surfaces of the die 204 and the die 104 are processed to be sufficiently clean and smooth. Then, the die 204 is picked-and-placed on the die 10, the die 204 and the die 104 are aligned and placed in physical contact at room temperature with slight pressure to initiate a bonding operation. Thereafter, a thermal treatment such as an annealing process at elevated temperatures is performed to strengthen the chemical bonds between the to-be-bonded surfaces of the die 204 and the die 104 and to transform the chemical bonds into covalent bonds. In some embodiments, a bonding interface is formed between the bonding structure 120 of the die 104 and the bonding structure 220 of the device die 20. In some embodiments, the bonding interface is a hybrid bonding interface including a metal-to-metal bonding interface between the bonding pads 123 and the bonding pads 223, the dummy pads 125 and the dummy pads 225, and a dielectric-to-dielectric bonding interface between the dielectric layer 119 and the dielectric layer 219.

Figure 12:
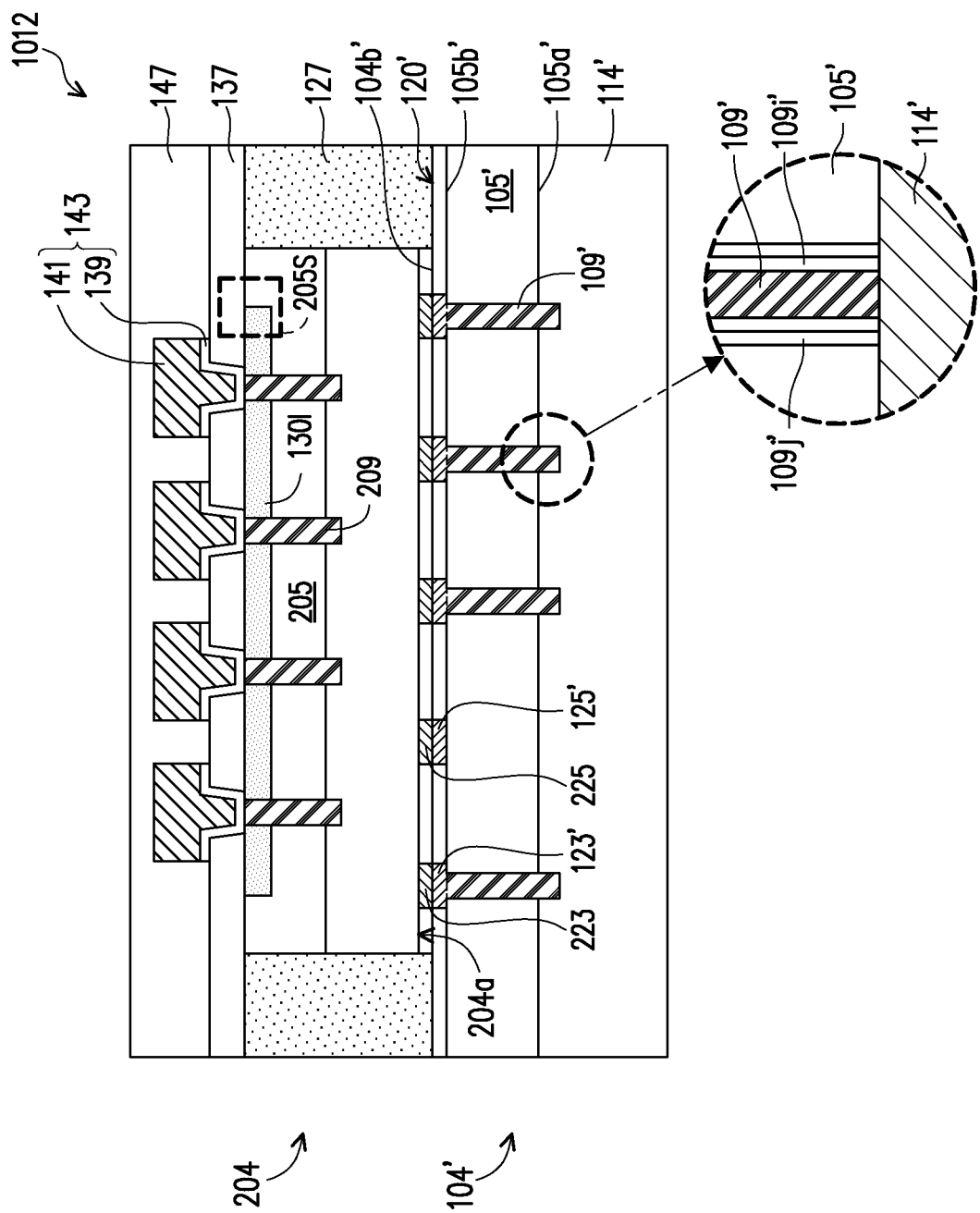

In some embodiments, the die 204 is bonded to the die 104 in a face-to-face configuration. That is, the front surface of the die 204 faces the front surface 104a of the die 104. However, the disclosure is not limited thereto. In some embodiments, the die 204 may be bonded to a die 104' in a face-to-back configuration as shown in FIG. 12. In other words, the front surface of the one of the dies 104' and 204 may face the back surface of the other one of the dies 104' and 204, or the back surface of the die 204 may face the back surface of the die 104'. Throughout the specification, a "front surface" of a die refers to a surface close to contact pads, and may also be referred to as an active surface; a "back surface" of a die is a surface opposite to the front surface and may be a surface of the substrate, which may also be referred to as a rear surface.

Referring to FIG. 1A, after the die 204 is bonded to the die 104, a backside grinding process may be performed to thin the die 204, and the conductive vias 209 may not be revealed after the backside grinding process. As shown in FIG. 1A, in some embodiments, the conductive vias 209 may not be revealed from the top surface (e.g. back surface) 204b of the die 204, the backside grinding is stopped when there is a thin layer of the substrate 205 covering the conductive via 209. However, the disclosure is not limited thereto. In some other embodiments, the conductive vias 209 are revealed at this time, and the top surfaces of the conductive vias 209 and the top surfaces of the liners 209j may be substantially coplanar with the top surface (e.g. back surface) of the substrate 205. In some embodiments, the backside grinding process may be skipped. In some embodiments, the conductive vias 209 may be revealed after a planarization process is performed to remove a portion of an encapsulation 127 (shown in FIG. 1B) over the top of the die 204.

Referring to FIG. 1B, an encapsulation 127 is formed over and surrounding the die 204. The respective process is illustrated as step S12 in the process flow shown in FIG. 14. In some embodiments, the encapsulation 127 includes one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other some embodiments, the encapsulation 127 includes one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In some embodiments, the encapsulation 127 includes a molding compound, such as an epoxy, a resin, a moldable polymer, a combination thereof, or the like. The molding compound may be applied while substantially liquid, and then may be cured through a chemical reaction, such as in an epoxy or resin. In some embodiments, the molding compound is an ultraviolet (UV) or thermally cured polymer applied as a gel or malleable solid capable of being disposed around and between the die 204.

Referring to FIG. 1C, the encapsulation 127 and the die 204 are planarized, such that backside surface 204c of the die 204 is substantially level or coplanar with a topmost surface 127b of the encapsulation 127. In some embodiments, the conductive vias 209 are revealed at this time, and the top surfaces 209b of the conductive vias 209 and the top surfaces of the liners 209j may be substantially coplanar with the top surface (e.g. back surface) 205b of the substrate 205. In such embodiments, the conductive vias 209 may also be referred to as through vias (TVs) 209 or through substrate vias (TSVs) 209. In some embodiments, the planarization process may include a CMP process, a grinding process, an etching process, a combination thereof, or the like. For the sake of simplicity, the layers, the contact pads and elements between the substrate 105 and the insulating layer 119, and between the substrate 205 and the insulating layer 219 are not shown in FIG. 1D through FIG. 1I.

Figure 1D:
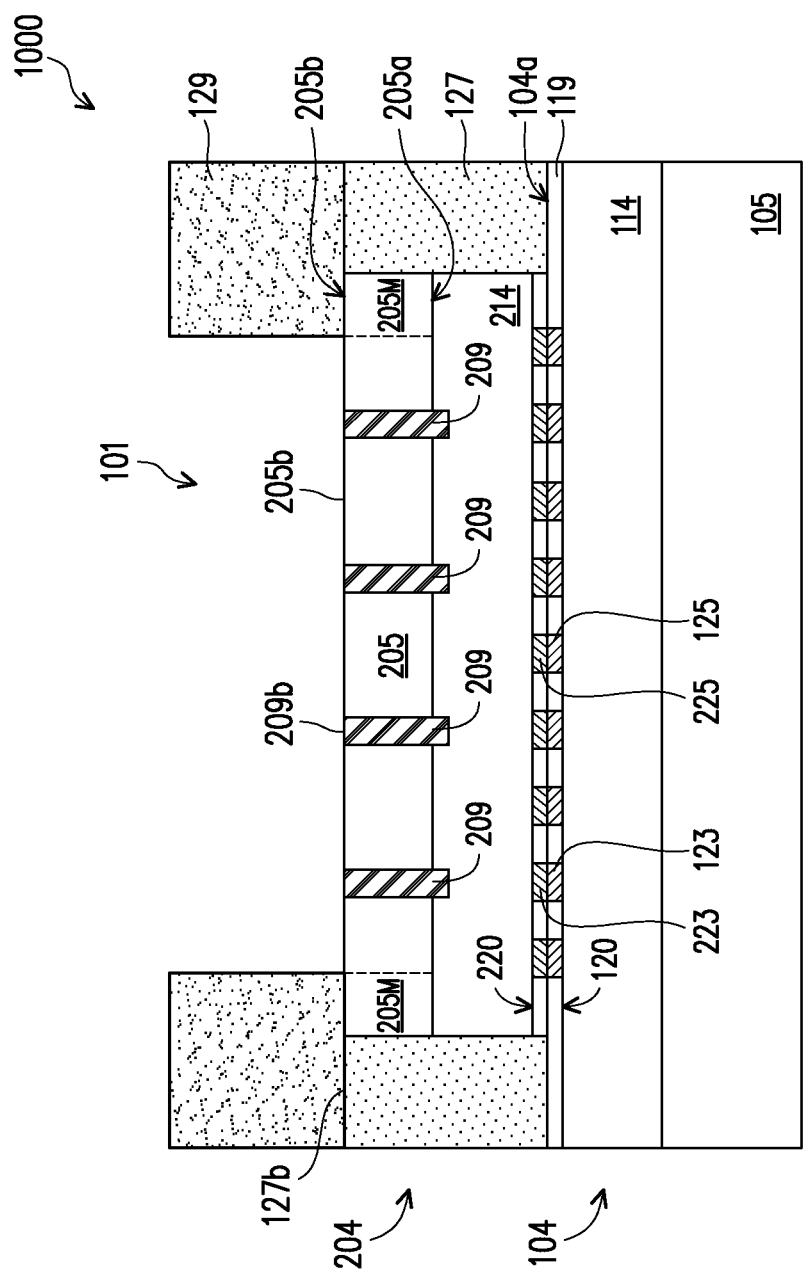
Figure 1E:
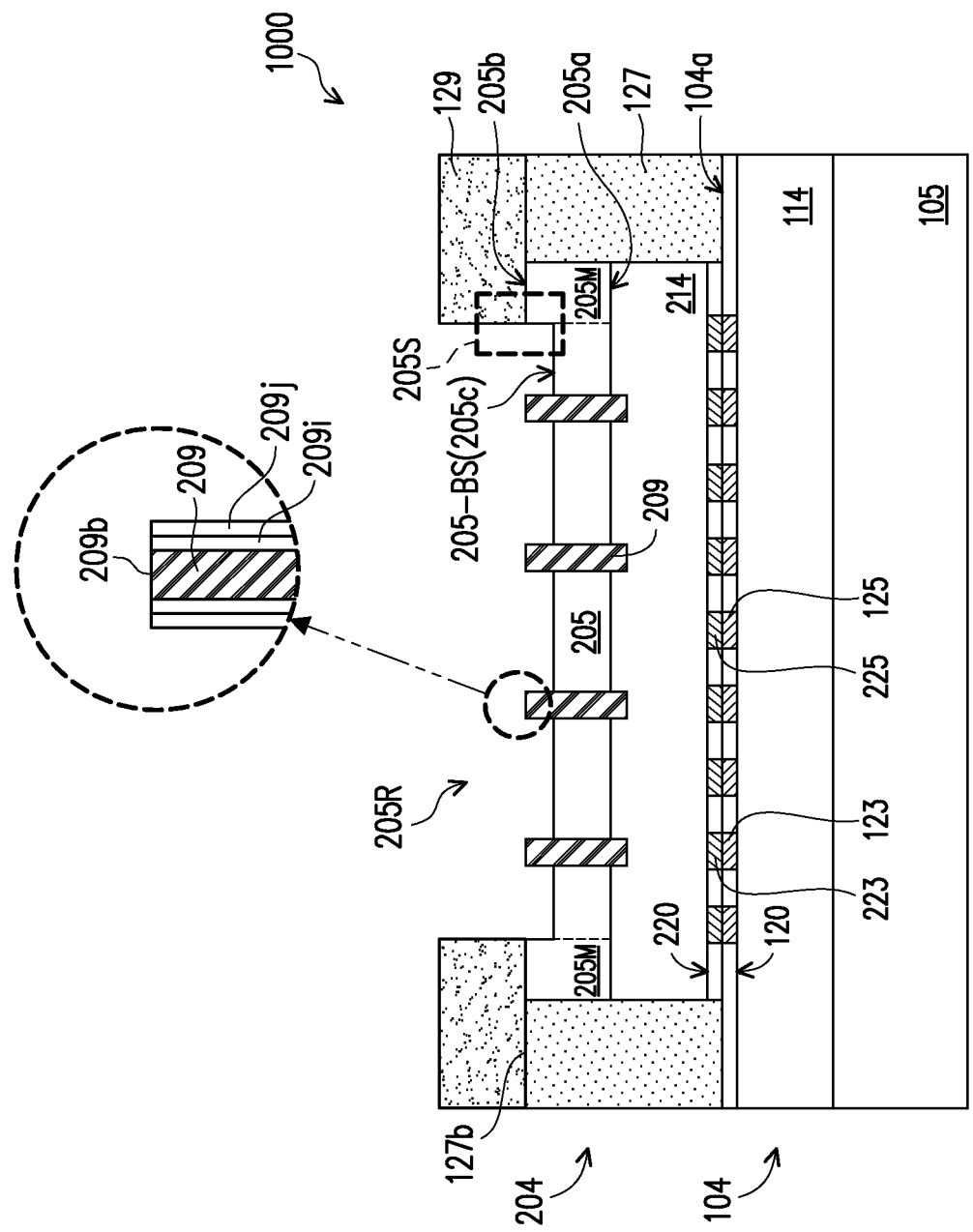

FIG. 1D through FIG. 1E illustrate the formation of a recess 205R in the die 204 according to some embodiments of the disclosure. In some embodiments, the recess 205R is formed through a patterning process by using a mask layer 129. The respective process is illustrated as step S14 to S18 in the process flow shown in FIG. 14.

Referring to FIG. 1D, the mask layer 129 is formed on the die 104 to cover the top surface 127b of the encapsulation 127 and portions of the top surface 204b of the die 204. In some embodiments, the mask layer 129 includes a photoresist layer, and may be formed by spin coating. The photoresist layer is then patterned by an acceptable process, such as by using exposing the photoresist layer to light. The patterning forms the opening 101 that exposes the top surfaces 209b of the TSVs 209 and a center portion of the top surface 205b of the substrate 205 around the TSVs 209.

Referring to FIG. 1D and FIG. 1E, in some embodiments, the substrate 205 exposed by the opening 101 is recessed such that a recess 205R is formed across the substrate 205, and the TSVs 209 protrude from the substrate 205. For example, portions of the substrate 205 laterally aside the TSVs 209 may be removed by an etching process, such as a wet etching process, dry etching process, or a combination thereof. The etching process may utilize a high etching selectivity ratio between the substrate 205 and other adjacent materials (i.e. the TSVs 209 and the liners 209j). In some embodiments, the liner 209j may be substantially remaining after the etching process, but the disclosure is not limited thereto. In some embodiments, portions of the liners 209j may also be removed by the etching process.

Figure 3:
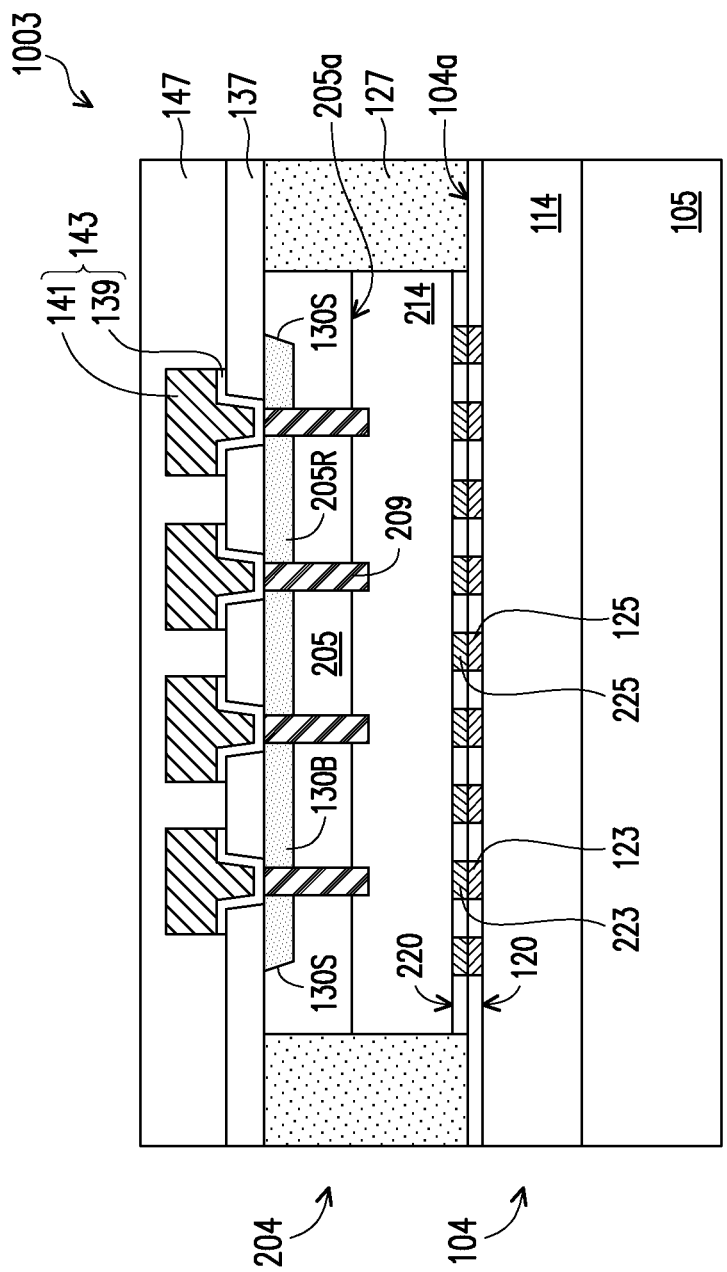

After the recessing process is performed, the remaining substrate 205 covered by the mask layer 129 forms sidewalls of the recess 205R, and a surface 205c of the remaining substrate 205 exposed by the opening 101 form a bottom 205-BS of the recess 205R. The recess 205R may have the depth of 1 μm to 3 μm, for example. In some embodiments, the sidewalls of the recess 205R may be straight, and perpendicular to front surface 205a of the substrates 205 as shown in FIG. 1E. In some embodiments, the sidewalls of the recess 205R may be inclined, and tapered toward the front surface 205a of the substrates 205 as shown in FIG. 3.

The bottom of the recess 205R exposes the surface 205c of the substrate 205, and the surface 205c of the substrate 205 are lower than the top surface 205b of the substrate 205, and have a step 205S therebetween. Furthermore, the surface 205c of the substrate 205 are lower than the top surfaces 209a of the TSVs 209, so that the TSVs 209 has portions protruded from the surface 205c of the substrate 205 (e.g. the bottom 205-BS of the recess 205R).

The top surface 127b of the encapsulation 127 and the top surface 205b of the portion 205M of the substrate 205 are covered by the mask layer 129 to prevent/reduce etching of the encapsulation 127, and not exposed by the recess 205R during the etching process. Therefore, the top surface 127b of the encapsulation 127 may be protected from pit defects and chamber contamination may be reduced during the TSVs 209 are revealed.

Figure 1F:
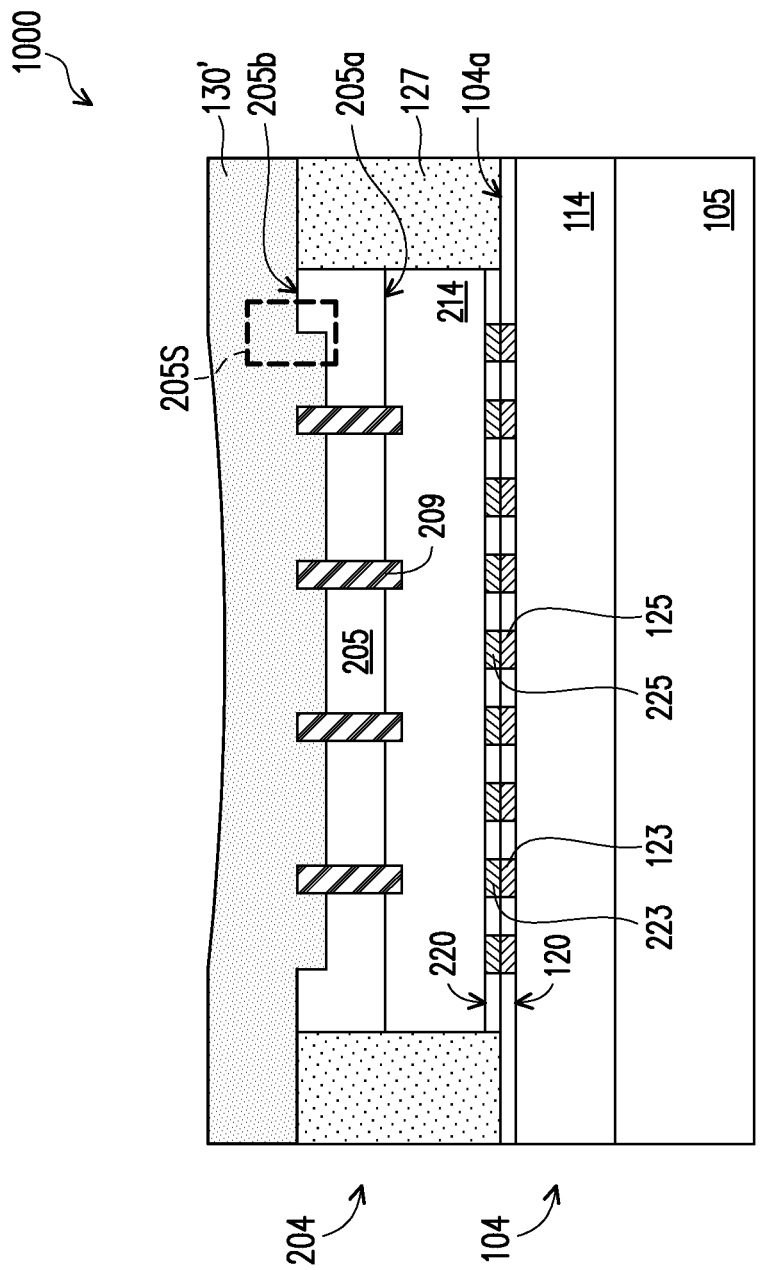
Figure 1G:
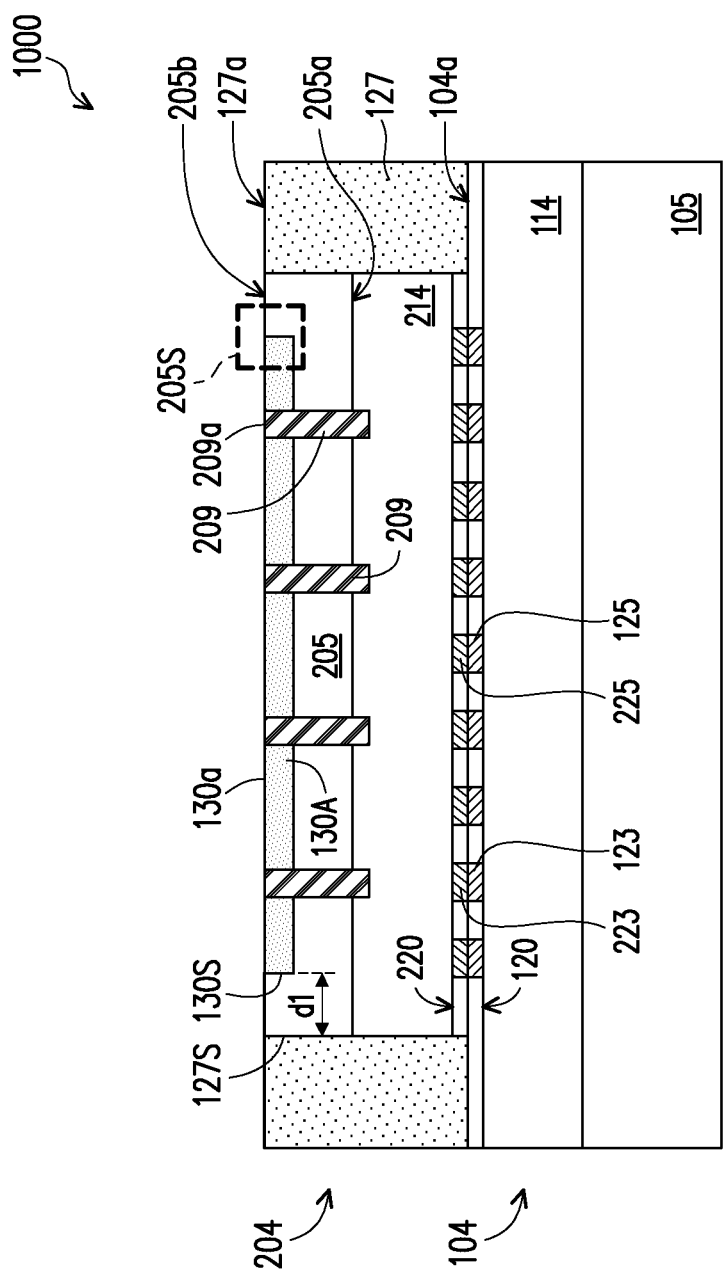

FIG. 1F through FIG. 1G illustrate the formation of an isolation layer 130 embedded in the substrate 205 of the die 204 according to some embodiments of the disclosure. In some embodiments, the isolation layer 130 is formed as a bulk layer and separated from the encapsulation 127. The respective process is illustrated as step S18 to step S24 in the process flow shown in FIG. 14.

Referring to FIG. 1F, the mask layer 129 is removed by an acceptable ashing or stripping process, such as using an oxygen plasma or the like. An isolation material layer 130' is formed on the die 204 and the encapsulation 127 to cover the top surface 205a of the substrate 205, the top surfaces 209a of the TSVs 209 and the top surface 127b of the encapsulation 127 and fill the recess 205R. In some embodiments, the isolation material layer 130' is formed to have a thickness at least equal to the height of the recess 205R (e.g. the thickness of the portion of the TSVs 209 protruded from the surface 205c of the substrate 205). In other words, the isolation material layer 130' fully fills the recess 205R. In some embodiments, the isolation material layer 130' is a conformal layer, that is, the isolation material layer 130' has a substantially equal thickness within process variations extending along the region on which the isolation material layer 130' is formed.

The isolation material layer 130' may include a dielectric material such as silicon nitride, although other dielectric materials such as silicon oxide, silicon carbide, silicon nitride, silicon oxynitride, oxygen-doped silicon carbide, nitrogen-doped silicon carbide, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like may also be used for the isolation material layer 130'. The isolation material layer 130' may be formed using a suitable deposition process, such as CVD, atomic layer deposition (ALD), or the like. In some embodiments, the isolation material layer 130' may be a single layer as shown in FIG. 1F. In some embodiments, the isolation material layer 130' may be multiple layers as shown in FIG. 4C, which will be described in detail later.

Referring to FIG. 1F and FIG. 1G, a planarization process is performed to remove a portion of the isolation material layer 130' over the top surface 209a of the TSVs 209 and the top surface 205b of the substrate 205, so as to reveal the TSVs 209, and an isolation layer 130A is formed. The planarization process may include a CMP process.

FIG. 2A illustrates a top view of FIG. 1G. FIG. 2B shows an enlarged view of the region A in FIG. 2A. FIG. 2C shows a cross-sectional view of a line I-I in FIG. 2B.

Referring to FIG. 1G and FIG. 2A to FIG. 2C, the isolation layer 130A is embedded in the substrate 205 and laterally around the TSVs 209. The isolation layer 130A surrounds the upper sidewalls of the TSVs 209. The sidewalls and the bottom of the isolation layer 130A are surrounded by the substrate 205. The portion 205M of the substrate 205 is surrounded by the encapsulation 127. In other words, the isolation layers 130 are laterally separated from the encapsulation 127 by the portion 205M of the substrate 205 which are covered by the mask layer 129 previously, and the sidewalls 130S of the isolation layer 130A and sidewalls 127S of the encapsulation 127 have a non-zero distance d1. In some embodiments, the sidewalls 130S of the isolation layers 130 may be straight, and perpendicular to front surface 205a of the substrates 205, but the disclosure is not limited thereto.

Referring to FIG. 1G, in some embodiments, a top surface 130a of the isolation layer 130A may be substantially coplanar within process variations with the top surfaces 209a of the TSVs 209, the top surface 205b of the substrate 205, and the top surface 127b of the encapsulation 127. In some embodiments, the isolation layer 130A may further extend to cover the top surface 127b of the encapsulation 127 (not shown).

Referring to FIGS. 1G, 2A, 2B and 2C, the isolation layer 130A is a bulk layer (or referred to as a whole layer or a continuous layer). The isolation layer 130A may have various shapes, such as a square, a rectangle, a circle, and an ellipse, or a combination thereof. The upper sidewalls of the TSVs 209 is surrounded by the isolation 130A, the middle sidewalls of the TSVs 209 is surrounded by the substrate 205, and the lower sidewalls of the TSVs 209 is surrounded by the interconnection structure 214. Further, in some embodiments, the adhesive layer 209i and the liner 209j may be sandwiched between the TSVs 209 and the isolation 130A, the TSVs 209 and the substrate 205, and the TSVs 209 and interconnection structure 214.

Figure 1H:
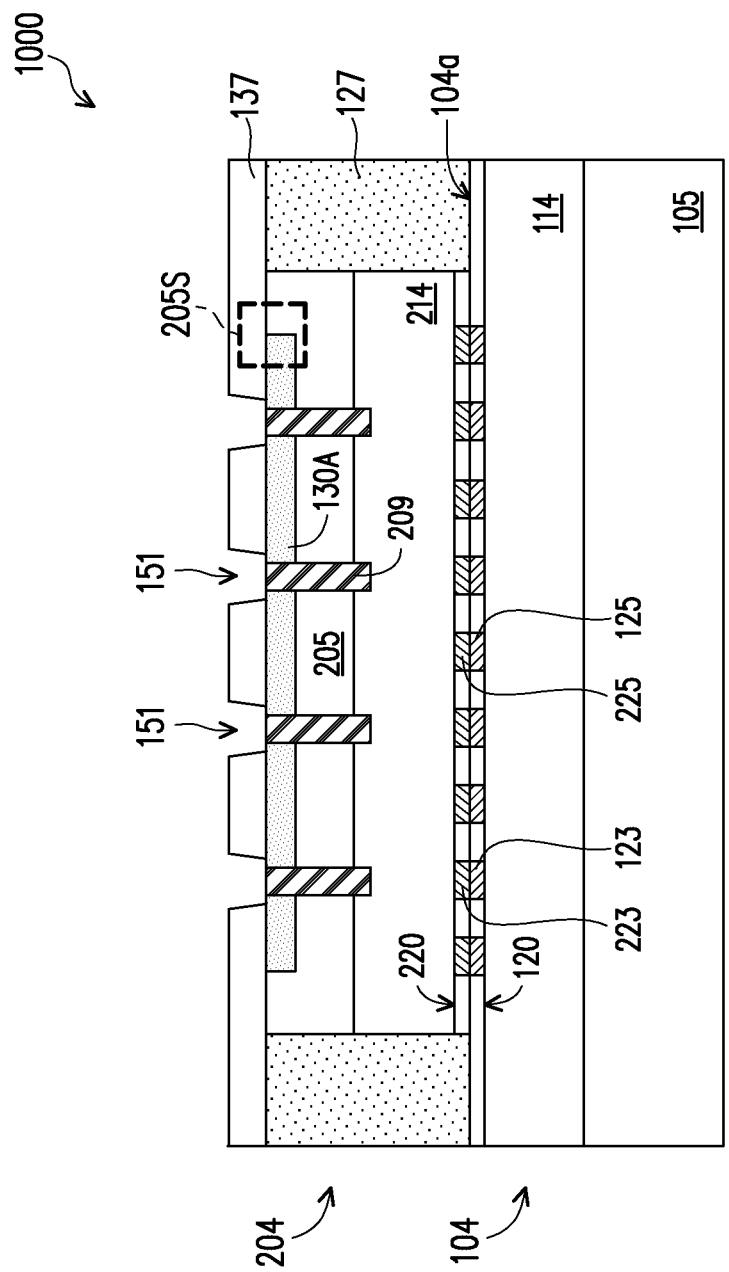
Figure 1I:
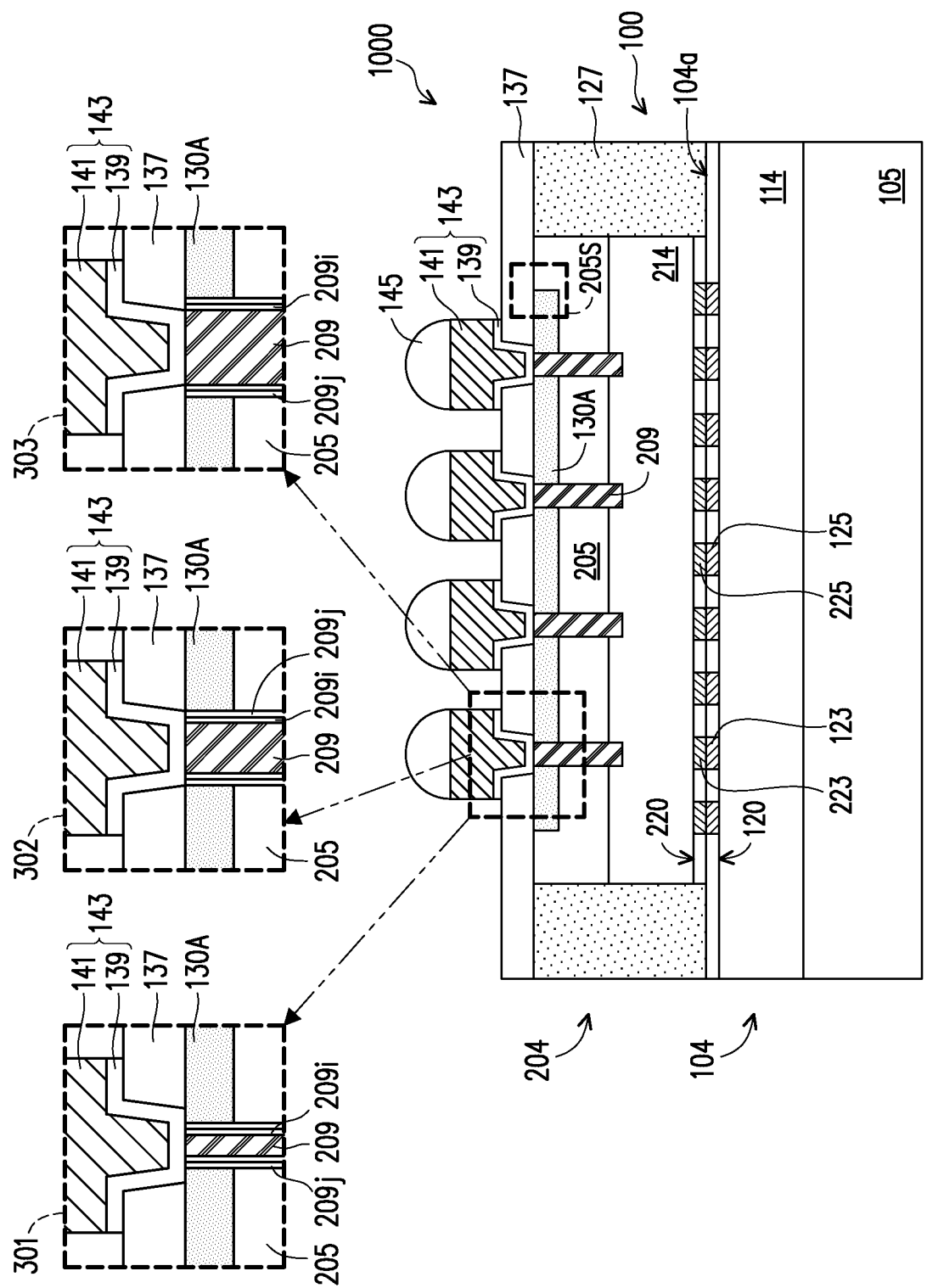
Figure 1J:
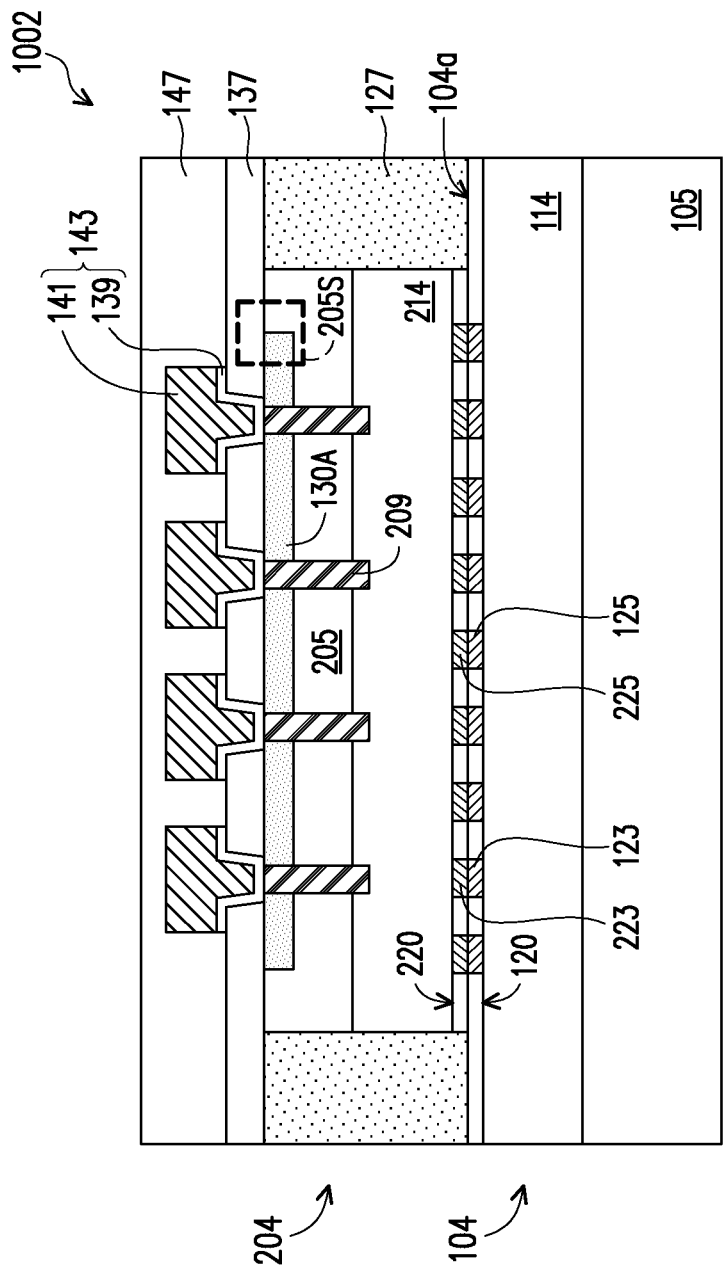

FIG. 1H through FIG. 1J illustrate the formation of a buffer layer 137, conductive terminals 143, and an insulating layer 147 over the encapsulation 127 and the die 204 according to some embodiments of the disclosure. The respective process is illustrated as step S20 in the process flow shown in FIG. 14.

Referring to FIG. 1H, the buffer layer 137 is formed over the encapsulation 127 and the die 204. The buffer layer 137 may include a single layer or multiple layers. The buffer layer 137 may include silicon oxide, silicon nitride, silicon oxynitride, USG, TEOS, a polymer, or a combination thereof. The polymer includes a photo-sensitive material such as polybenzoxazole (PBO), polyimide (PI), benzocyclobutene (BCB), a combination thereof or the like. The forming method of the buffer layer 137 include suitable fabrication techniques such as spin coating, chemical vapor deposition (CVD), plasma-enhanced chemical vapor deposition (PECVD), lamination or the like.

Thereafter, openings 151 are formed in the buffer layer 137. The openings 121 may have sizes greater than, equal to, or smaller than the sizes of the TSVs 209. In some embodiments, the openings 151 are via holes and penetrate through the buffer layer 137 to expose the corresponding TSVs 209. In some embodiments, the openings 151 are trenches and penetrate through the buffer layer 137 to expose the TSVs 209. The openings 151 are formed to further expose the isolation layer 130A around the TSVs 209. The forming method of the openings 151 may include photolithography and etching processes, a laser drilling process, or a combination thereof. In some embodiments, the isolation layer 130A and the buffer layer 137 have different materials, so the isolation layer 130A may be used as an etching stop layer during the etching process for forming the openings 151. The sidewalls of the openings 151 may be straight or inclined. In some embodiments, the sidewalls of the openings 151 is inclined, and the taper toward the front surface 205a of the substrates 205, but the disclosure is not limited thereto.

Referring to FIG. 1I, the conductive terminals 143 are formed on the buffer layer 137 and in the openings 151 to electrically couple to the TSVs 209. The conductive terminals 143 may be referred to as die connectors 143. In some embodiment, the conductive terminals 143 are metal pillars such as a copper pillar. The material of the conductive terminal 143 may include copper, aluminum, lead-free alloys (e.g., gold, tin, silver, aluminum, or copper alloys) or lead alloys (e.g., lead-tin alloys). For example, the conductive terminals 143 may be formed of a Sn—Ag alloy, a Sn—Cu alloy, a Sn—Ag—Cu alloy, or the like, and may be lead-free or lead-containing.

In some embodiments in which the conductive terminals 143 are metal pillars, the conductive terminal 143 may include a seed layer 139 in the openings 151, and a conductive material 141 on the seed layer 139. As an example to form the conductive terminals 143, the seed layer 139 is formed on the surfaces of the openings 151 and a portion of the top surface of the buffer layer 137. In some embodiments, the seed layer 139 is a metal layer, which may be a single layer or a composite layer comprising a plurality of sub-layers formed of different materials. The seed layer 139 may include copper, titanium, titanium nitride, tantalum, tantalum nitride, or the like and may be formed by ALD, CVD, Physical Vapor Deposition (PVD), or the like. For example, the seed layer 139 comprises a titanium layer and a copper layer over the titanium layer. The seed layer 139 may be formed using, for example, PVD or the like. A photoresist is formed and patterned on the seed layer 139. The photoresist may be formed by spin coating or the like and may be exposed to light for patterning. The patterning forms openings through the photoresist to expose the seed layer 139. The conductive material 141 is formed in the openings of the photoresist and on the exposed portions of the seed layer 139. The conductive material 141 may be formed by plating, such as electroplating or electroless plating, or the like. The conductive material 141 may comprise a metal, like copper, titanium, tungsten, aluminum, or the like. The photoresist and portions of the seed layer 139 on which the conductive material 141 is not formed are removed. The photoresist may be removed by an acceptable ashing or stripping process, such as using an oxygen plasma or the like. Once the photoresist is removed, exposed portions of the seed layer 139 are removed, such as by using an acceptable etching process, such as by wet or dry etching. The remaining portions of the seed layer 139 and conductive material 141 form the conductive terminals 143.

In some embodiments, the bottoms of the conductive terminals 143 land on the TSVs 209 as shown in an enlarge view 303. In some embodiments, the bottoms of the conductive terminals 143 land on the TSVs 209 and the liners 209j as shown in an enlarge view 302. In some embodiment, the bottoms of the conductive terminals 143 land on the TSVs 209, the liners 209j and the isolation layer 130A, and the conductive terminals 143 is isolated from the substrate 205 by the isolation layer 130A as shown in an enlarge view 301.

In some embodiments, the metal pillars may be solder free and have substantially vertical sidewalls. In some embodiments, conductive caps 145 are formed on the top of the conductive terminals 143. The conductive caps may include nickel, tin, tin-lead, gold, silver, palladium, indium, nickel-palladium-gold, nickel-gold, the like, or a combination thereof and may be formed by a plating process.

Referring to FIG. 1I and FIG. 1J, a chip-probing process or other suitable chip testing process is performed on the wafer 100 to identify known good dies and bad dies. The conductive caps 145 are removed after the chip-probing process. Thereafter, the insulating layer 147 is formed on the conductive terminals 143 and the buffer layer 137. In some embodiments, the insulating layer 147 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the insulating layer 147 may include one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In some embodiments, the insulating layer 147 is planarized using a CMP process, a grinding process, an etching process, a combination thereof, or the like.

In some embodiments, thereafter, the wafer 100 is singulated, for example, by sawing, laser ablation, etching, a combination thereof, or the like to form individual 3DIC structures 1002 and one of the 3DIC structures 1002 is shown in FIG. 1J. The 3DIC structures 1002 is also referred to as a SoIC structure. The respective process is illustrated as step S26 in the process flow shown in FIG. 14.

FIG. 3 to FIG. 12 are schematic cross-sectional views illustrating various 3DIC structures 1003, 1004, $1004_1$, $1004_2$, $1004_3$, $1004_4$, 1006, 1007, 1008, 1009, 1010, 1011 and 1012 according to other some embodiments of the disclosure.

Referring to FIG. 3, the 3DIC structure 1003 is similar to the 3DIC structure 1002, the difference is that sidewalls 130S of an isolation layer 130B of the 3DIC structure 1003 is inclined, and tapered toward the front surface 205a of the substrates 205, but the disclosure is not limited thereto. The shape of the sidewalls 130S of the isolation layer 130B may be formed by tuning etching parameters of an etching process for forming recess 205R in the substrate 205.

Referring to FIG. 4C, the 3DIC structures 1004 is similar to the 3DIC structure 1002, wherein an isolation layer 130C of the 3DIC structures 1004 includes multiple layers. The multiple layers includes dielectric materials such as silicon nitride, although other dielectric materials such as silicon oxide, silicon carbide, silicon nitride, silicon oxynitride, oxygen-doped silicon carbide, nitrogen-doped silicon carbide, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like may also be used for the multiple layers. In some embodiments, the isolation layer 130C of the 3DIC structure 1004 includes a nitride layer $130_1$ such as a silicon nitride layer, and an oxide layer $130_2$ such as a silicon oxide layer. The nitride layer $130_1$ is formed on the substrate 205 to provide good water resistance, while the oxide layer $130_2$ is formed on the nitride layer $130_1$ to release the stress from the nitride layer $130_1$.

Figure 4A:
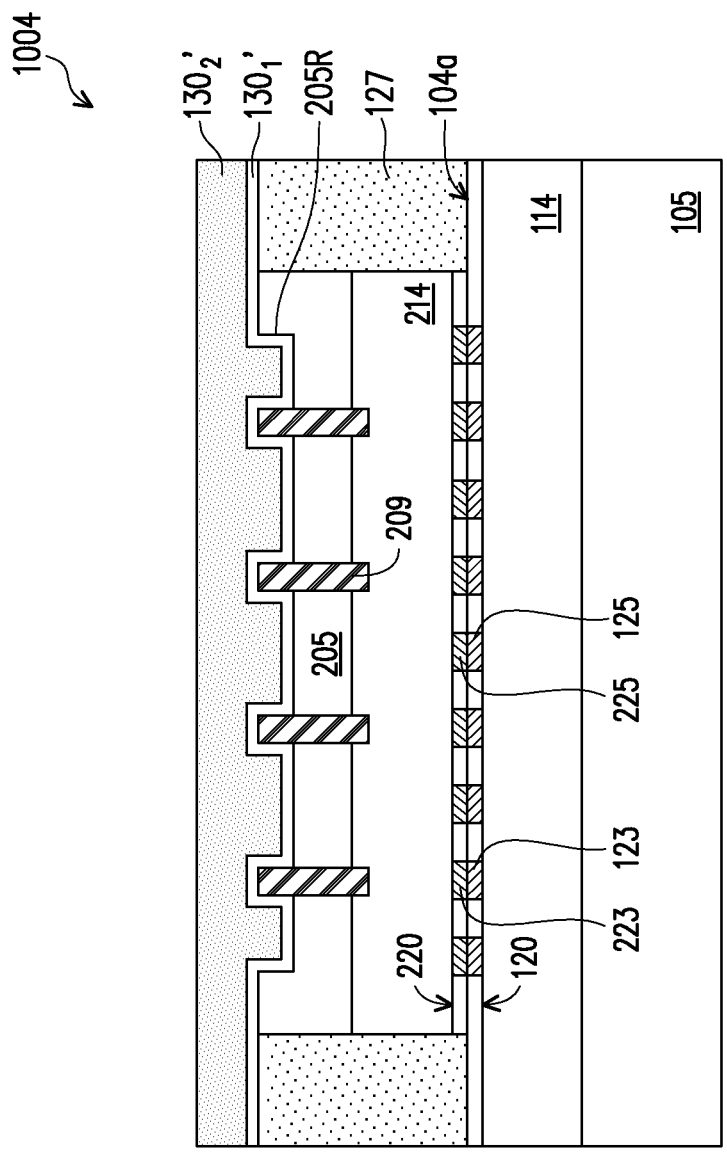
Figure 4B:
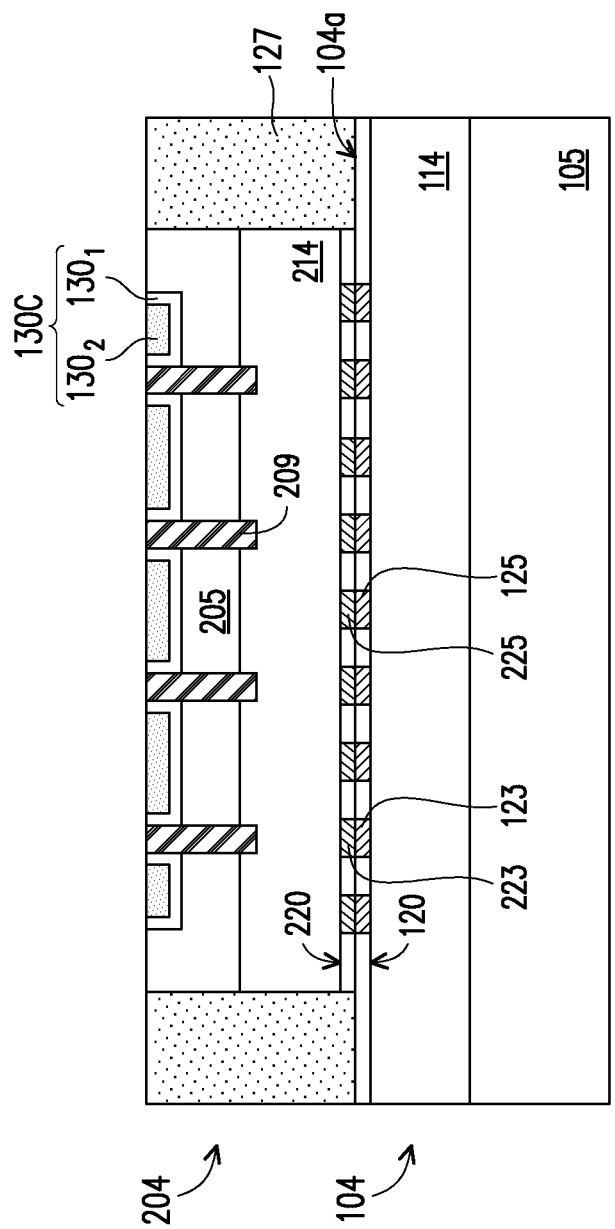
Figure 4C:
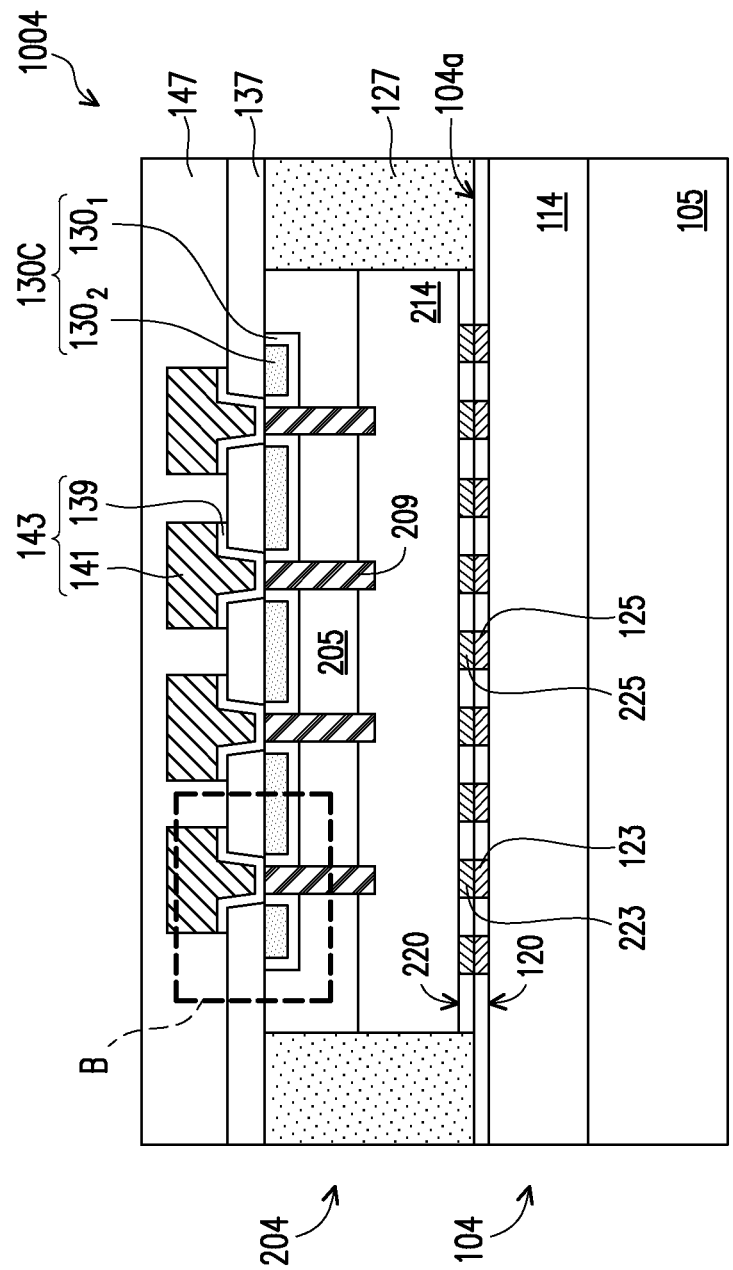

FIG. 4A to FIG. 4C are schematic cross-sectional views illustrating a method of forming a 3DIC structure 1004 according to some embodiments of the disclosure.

Referring to FIG. 4A to FIG. 4C, the oxide layer $130_2$ and the nitride layer $13o1$ may be formed by various method. In some embodiments, a nitride material layer $130_1$' is conformally formed and has a substantially equal thickness extending along the top surfaces 127b, of the insulation 127, the top surface 205b of the substrate, the sidewalls and bottom of recess 205R, the sidewalls of the liners 209j, and the top surface 2o9a of the TSVs 209. An oxide material layer $130_2$' is then formed on the nitride layer $130_1$ as shown in FIG. 4A. A planarization process is performed to remove a portion of the oxide material layer $130_2$' and the nitride material layer $130_1$', so as to reveal the TSVs 209, and the oxide layer $130_2$ and the nitride layer $130_1$ are formed as shown in FIG. 4B. Thereafter, a buffer layer 137, conductive terminals 143, and an insulating layer 147 are formed over the encapsulation 127 and the die 204 as shown in FIG. 4C.

The 3DIC structure 1004 may be a 3DIC structure $1004_1$, $1004_2$, $1004_3$, or $1004_4$ shown in FIG. 5A to FIG. 5D. FIG. 5A to FIG. 5D show enlarged views of a region B in FIG. 4C in accordance with various embodiments.

Referring to FIG. 5A to FIG. 5D, the nitride layer $130_1$ is filled in a space of the recess 205R, so that the bottom surface of the nitride layer $130_1$ is in contact with the substrate 205, and the sidewalls of the nitride layer $130_1$ is in contact with the liner 209j. The oxide layer $130_2$ is filled in a space of the recess 205R remained from the nitride layer $130_1$.

Figure 5A:
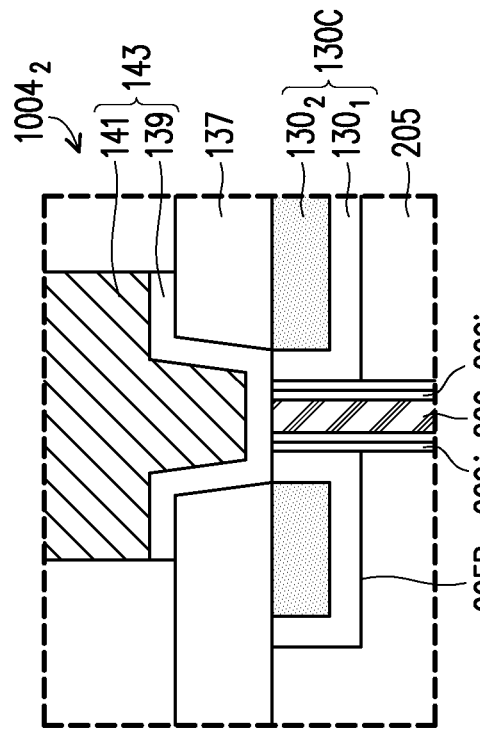
Figure 5B:
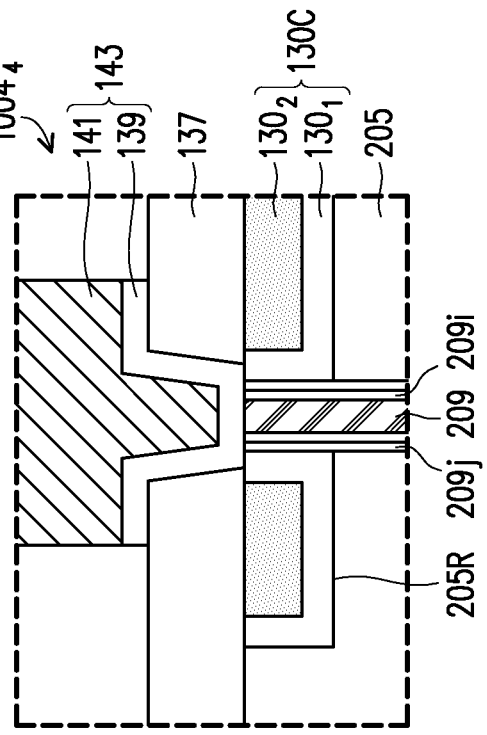
Figure 5C:
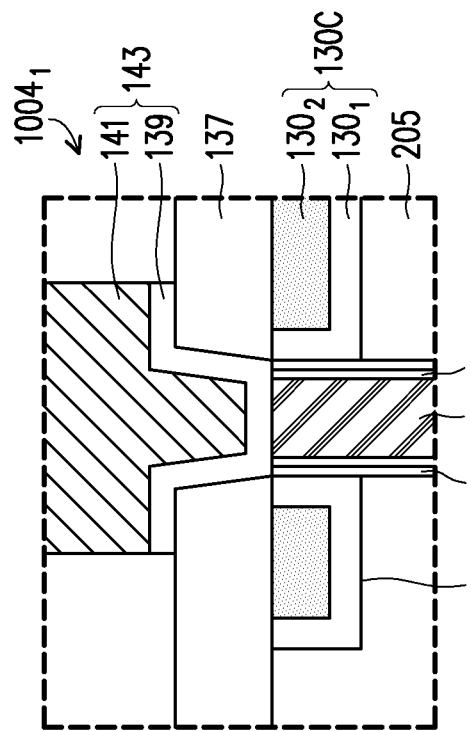
Figure 5D:
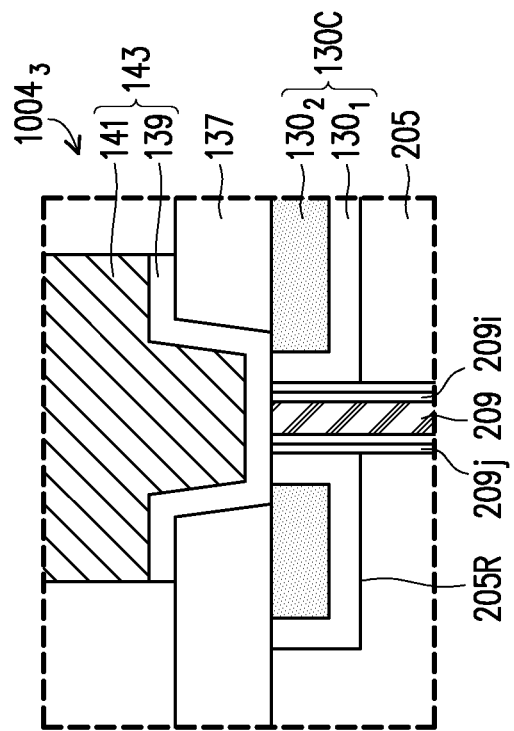

In some embodiments, the top surfaces of the nitride layer $130_1$ and the oxide layer $130_2$ are in contact with the buffer layer 137, and not in contact with the conductive terminal 143 as shown in FIG. 5A. In some embodiments, the top surfaces of the nitride layer $130_1$ is in contact with the conductive terminal 143, and the oxide layer $130_2$ are in contact with the buffer layer 137 as shown in FIG. 5B. In some embodiments, the top surfaces of the nitride layer $130_1$ is in contact with the conductive terminal 143, and the oxide layer $130_2$ is in contact with the conductive terminal 143 and the buffer layer 137 as shown in FIG. 5C. In some embodiments, the top surface of the nitride layer $130_1$ is in contact with the conductive terminals 143, and the buffer layer 137, and the oxide layer $130_2$ is in contact with the buffer layer 137 as shown in FIG. 5D. In some embodiments, the top surface of the oxide layer $130_2$ is substantially coplanar with the top surface of the nitride layer $130_1$, the top surface 205b of the substrate 205, the top surface 207a of the encapsulation 127, and the top surfaces of the liner 209j, the adhesive layer 209i, and the TSVs 209.

Figure 6A:
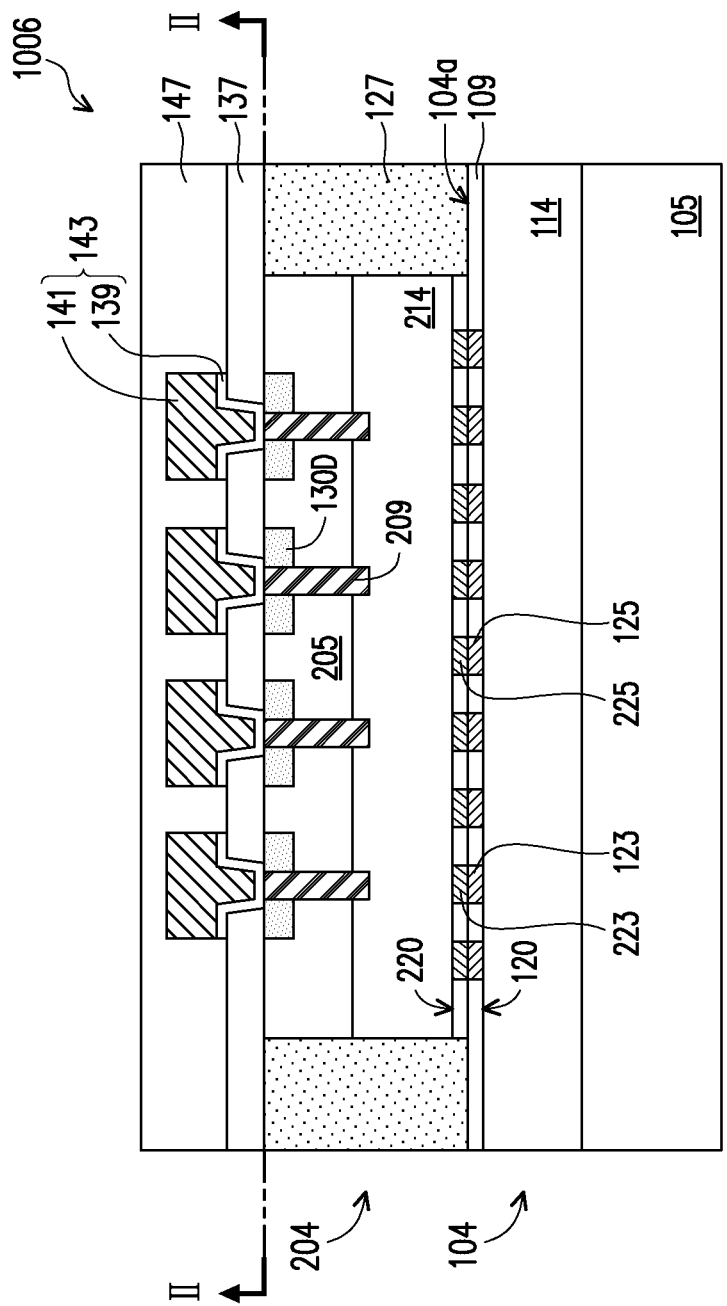
Figure 6B:
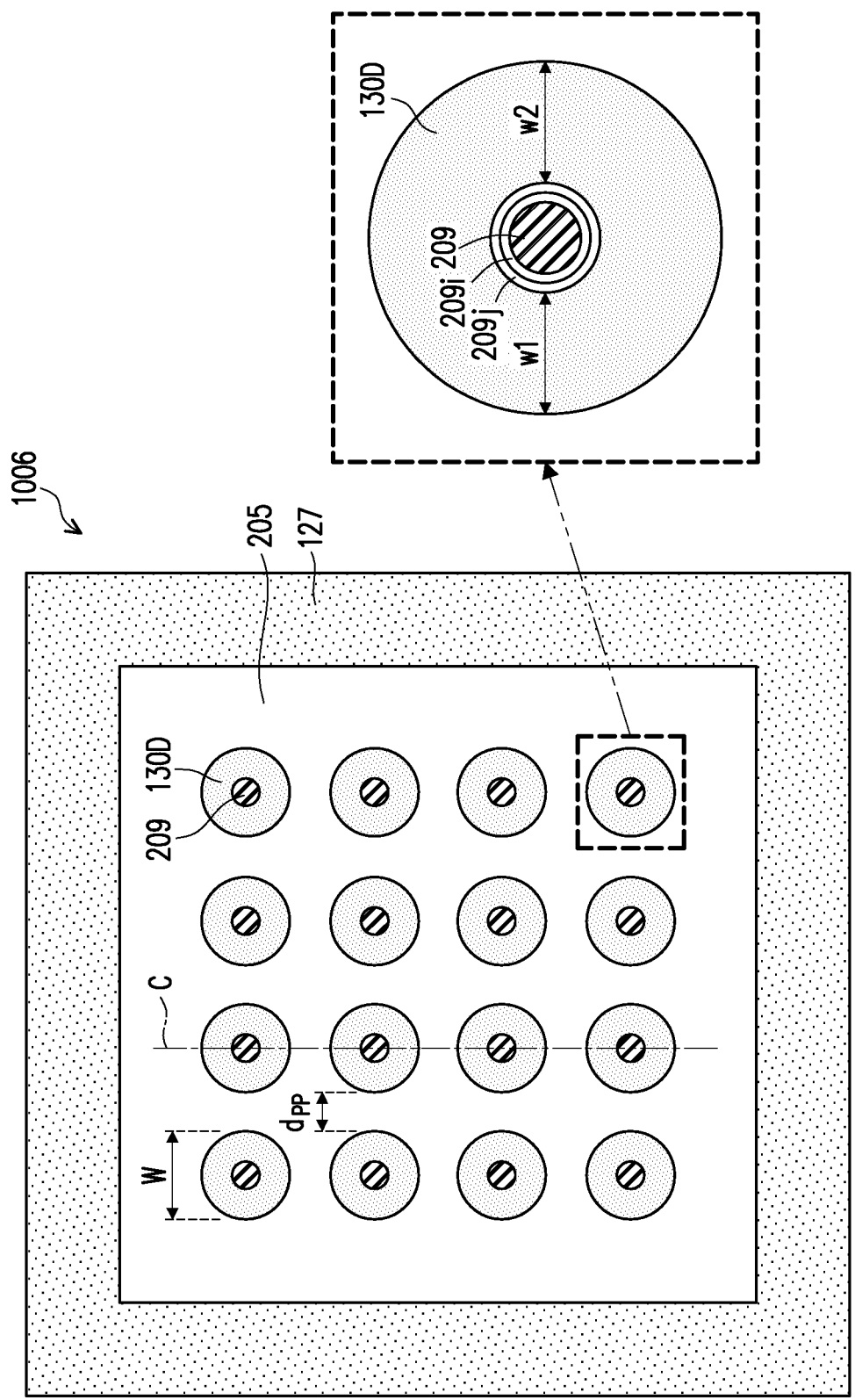
Figure 6C:
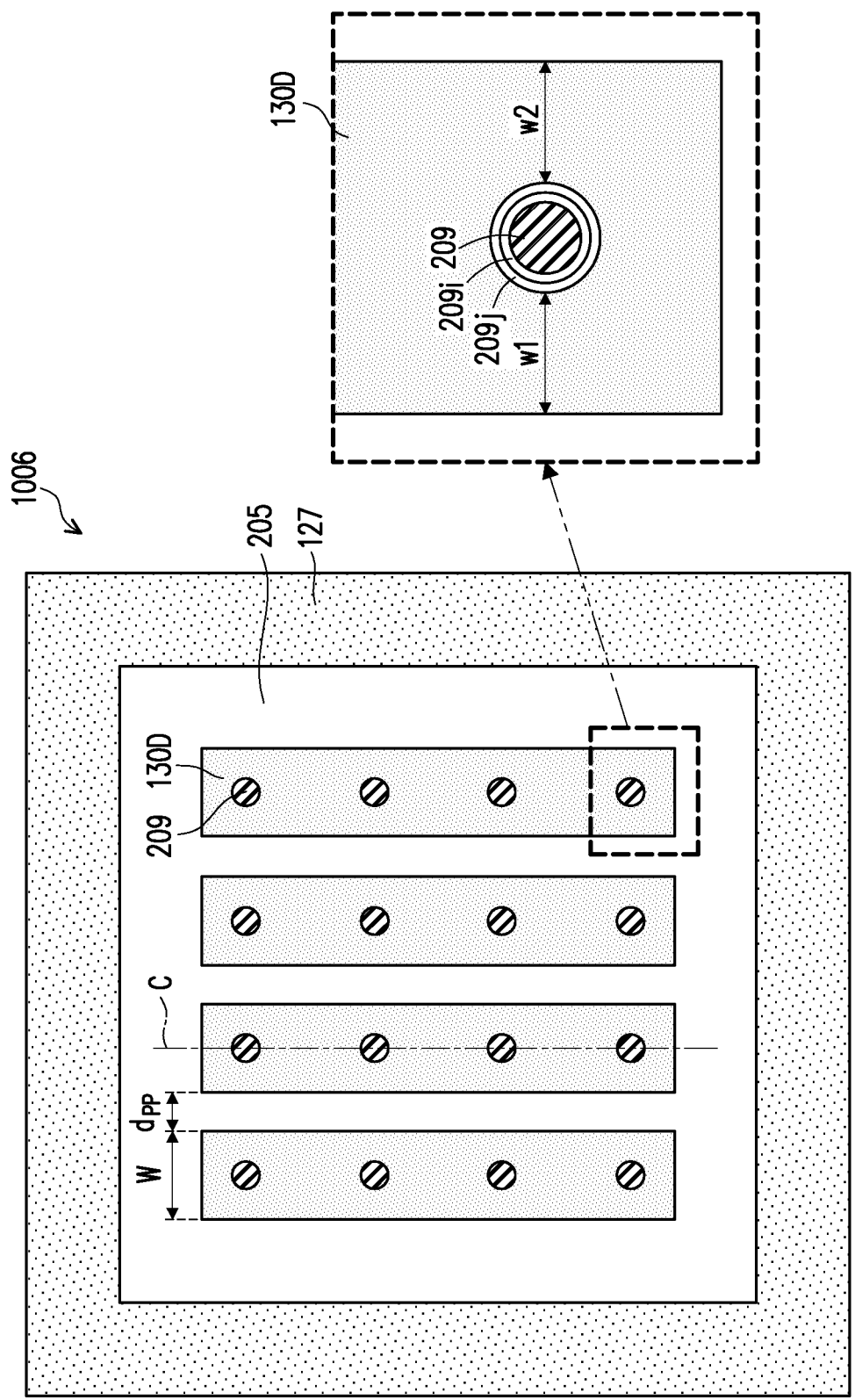
Figure 6D:
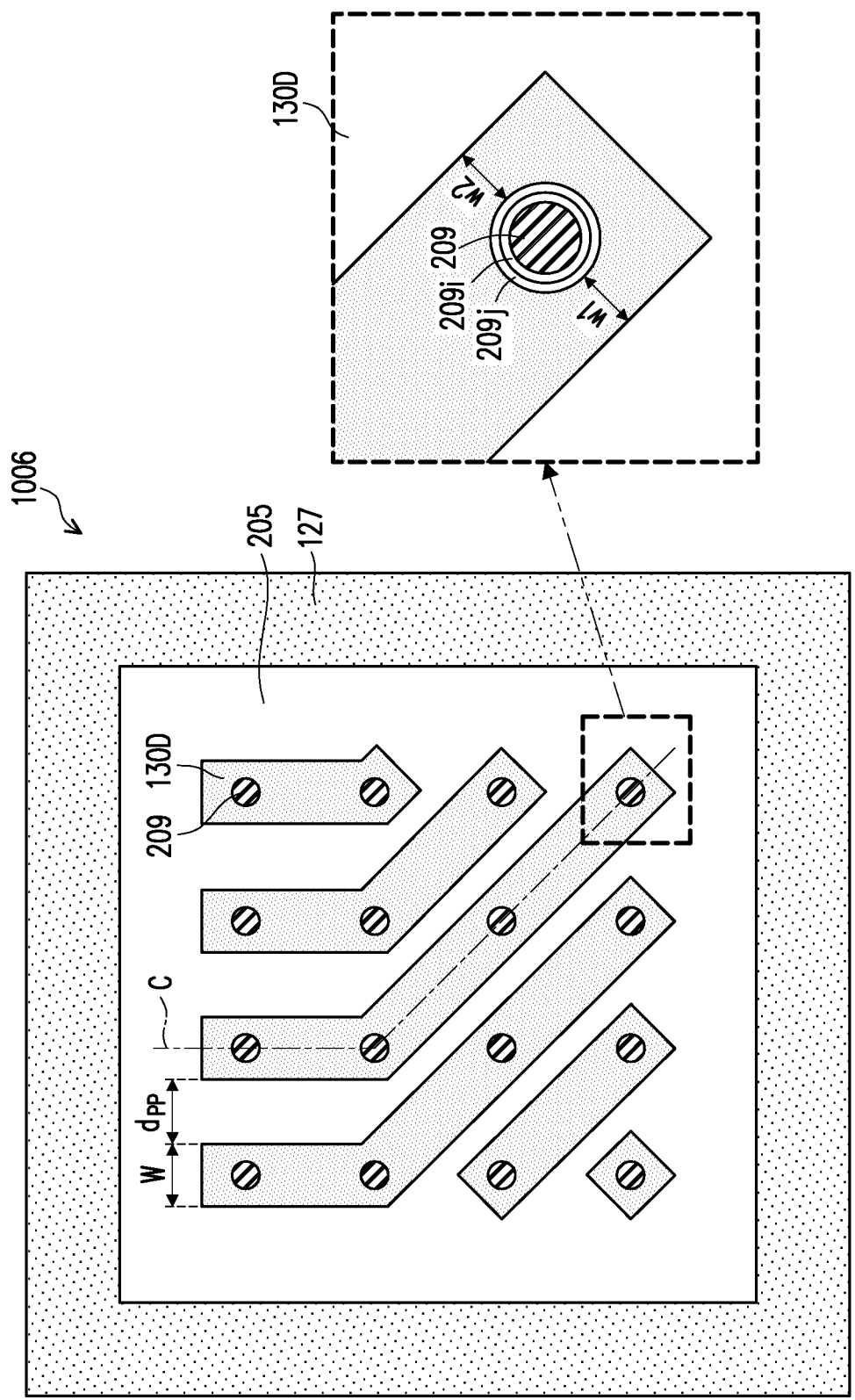
Figure 6E:
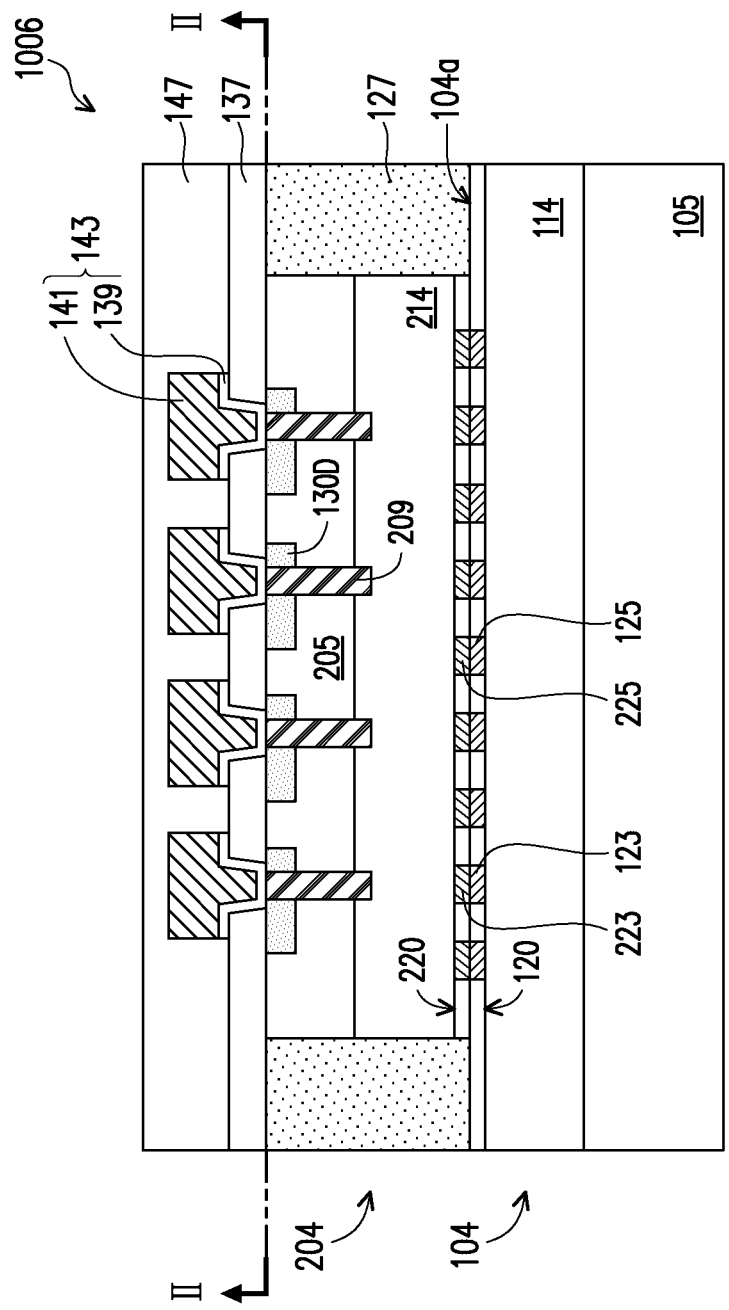
Figure 6F:
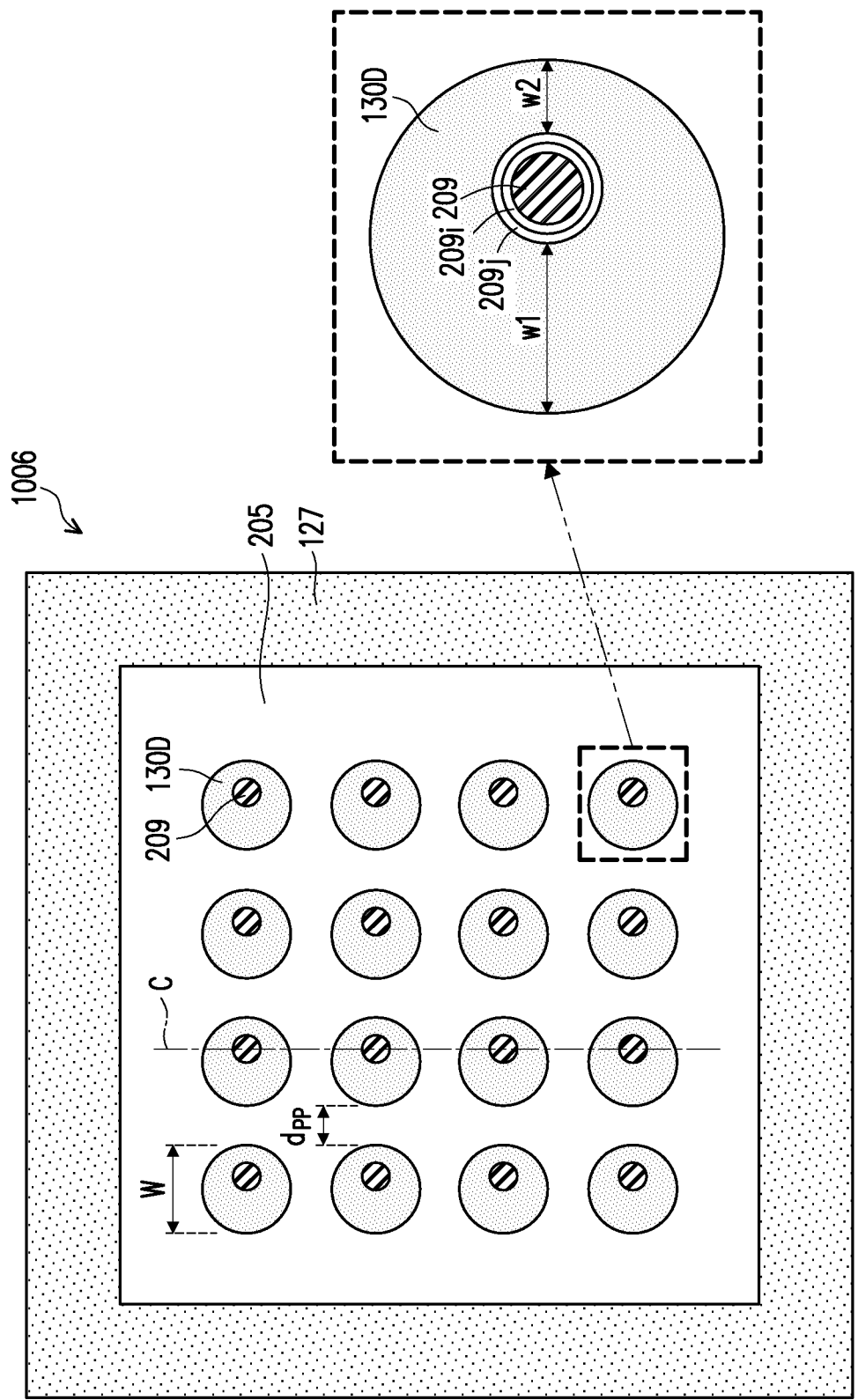
Figure 6G:
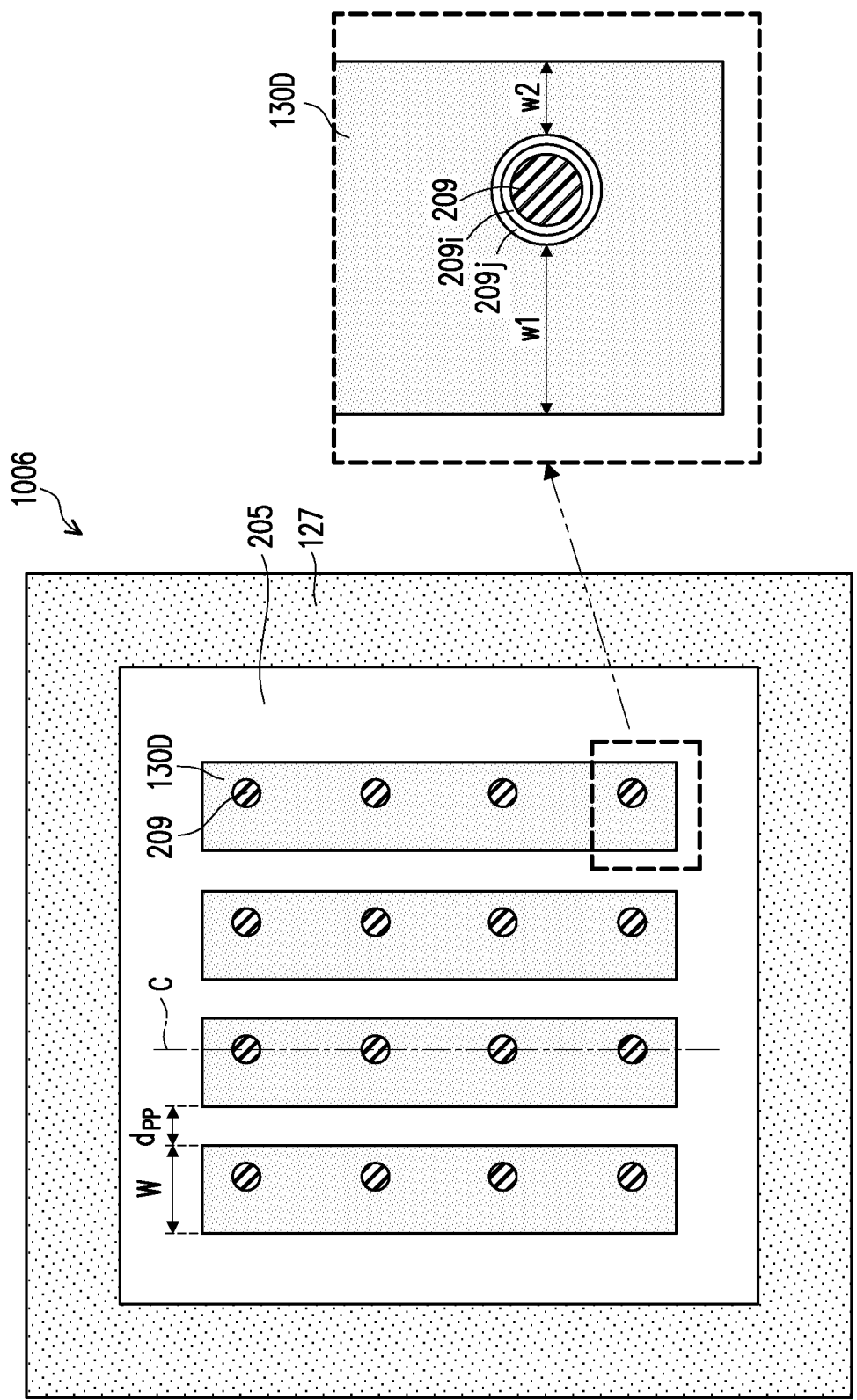

FIG. 6A to FIG. 6G are schematic various views illustrating 3DIC structures 1006 according to some embodiments of the disclosure. FIG. 6B to FIG. 6D show top views of a line II-II in FIG. 6A. FIG. 6F and FIG. 6G show top views of a line II-II in FIG. 6E.

Figure 6H:
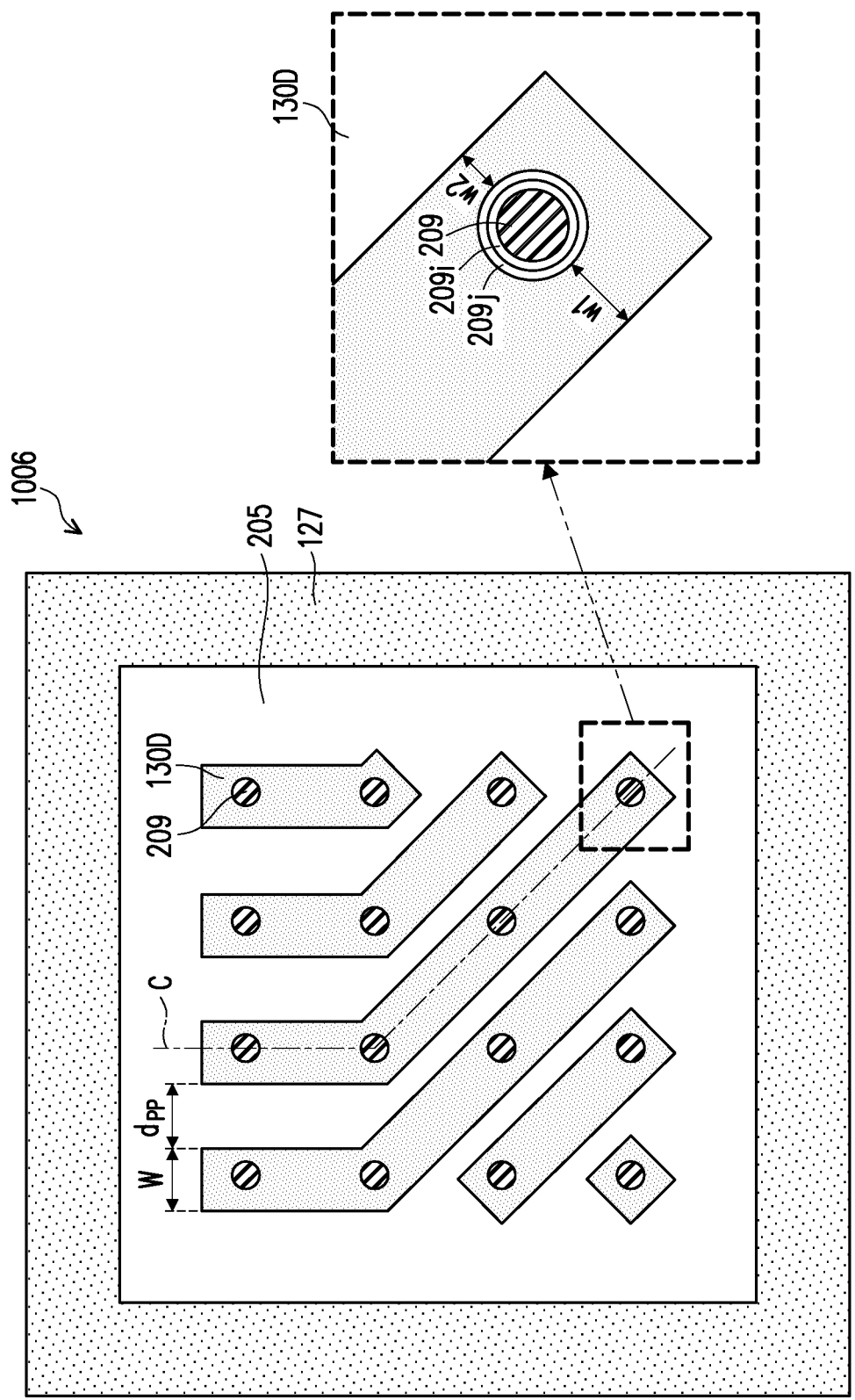

Referring to FIG. 6A to FIG. 6G, the 3DIC structures 1006 are similar to the 3DIC structure 1002, wherein a plurality of isolation parts 130D is utilized. Each of the plurality of isolation parts 130D may have a form such as those discussed above with reference to 130A, 130B, and/or 130C. In some embodiments, one or each of the plurality of isolation parts 130D may be a circle around a corresponding one or more of the TSVs 209 as shown in FIG. 6B and FIG. 6F, a strip around a corresponding one or more of the TSVs 209 as shown in FIG. 6D and FIG. 6G, or a bend line around a corresponding one or more of the TSVs 209 as shown in FIGS. 6D and 6H. However, the embodiment of the present disclosure is not limited to these, the plurality of isolation parts 130D may include a variety of shapes, and these shapes may be regular or irregular.

Each of the plurality of isolation parts 130D may surround the same number(s) of the TSVs 209. In some embodiments, each of the plurality of isolation parts 130D surrounds one TSV 209 as shown in FIG. 6B and FIG. 6F. In some embodiments, each of the plurality of isolation parts 130D surrounds four TSVs 209 as shown in FIG. 6C and FIG. 6G. The plurality of isolation parts 130D may have approximately the same width W and the same area. The width w1 or w2 of a portion of the plurality of isolation parts 130D between the sidewall of a corresponding dielectric layer 209j to a nearest edge of the isolation part 130D is about 0.5 μm to 1.5 μm, for example.

In some embodiments, each of the plurality of isolation parts 130D is arranged to align with the center or center line C of the corresponding TSV 209 as shown in FIG. 6A to FIG. 6D. In some embodiments, each of the plurality of isolation parts 130D is arranged to be offset from the center or center line C of the corresponding TSV 209 as shown in FIG. 6E to FIG. 6H. The distance $d_{pp}$ between adjacent ones of the plurality of isolation parts 130D may be the same as or different.

Figure 7A:
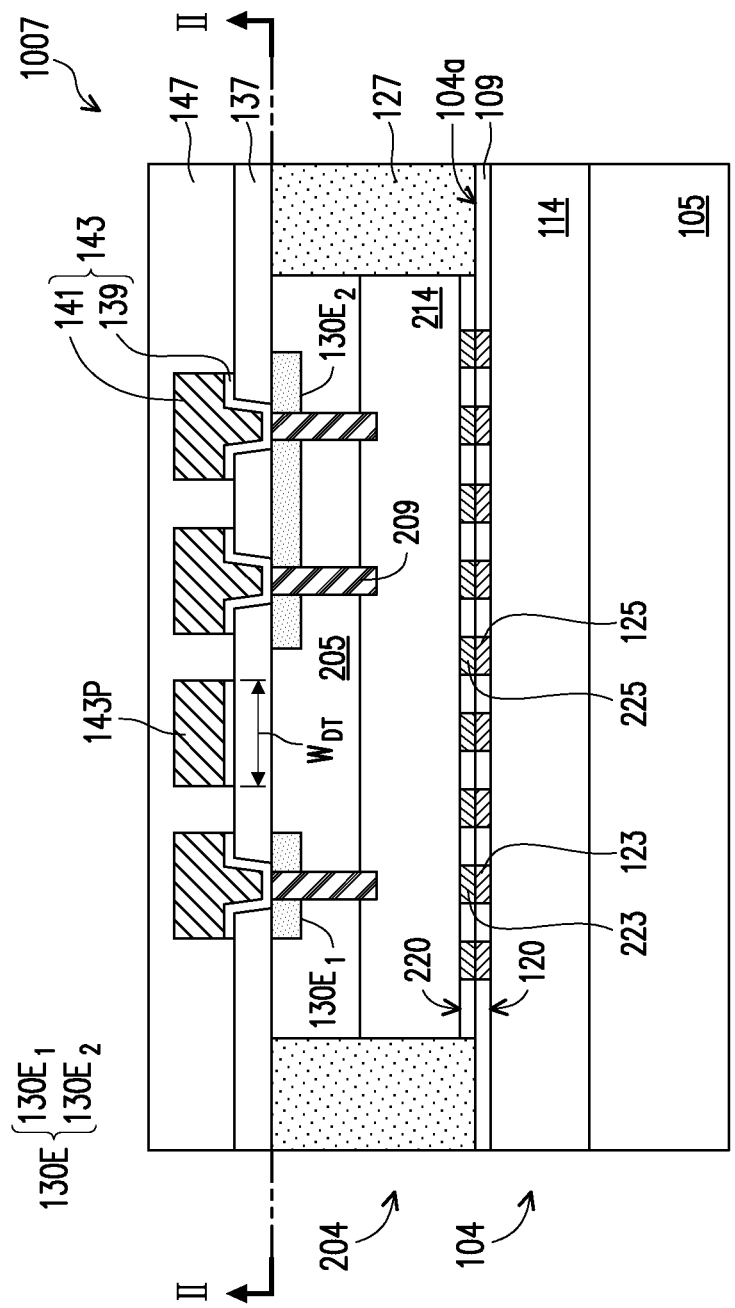
Figure 7B:
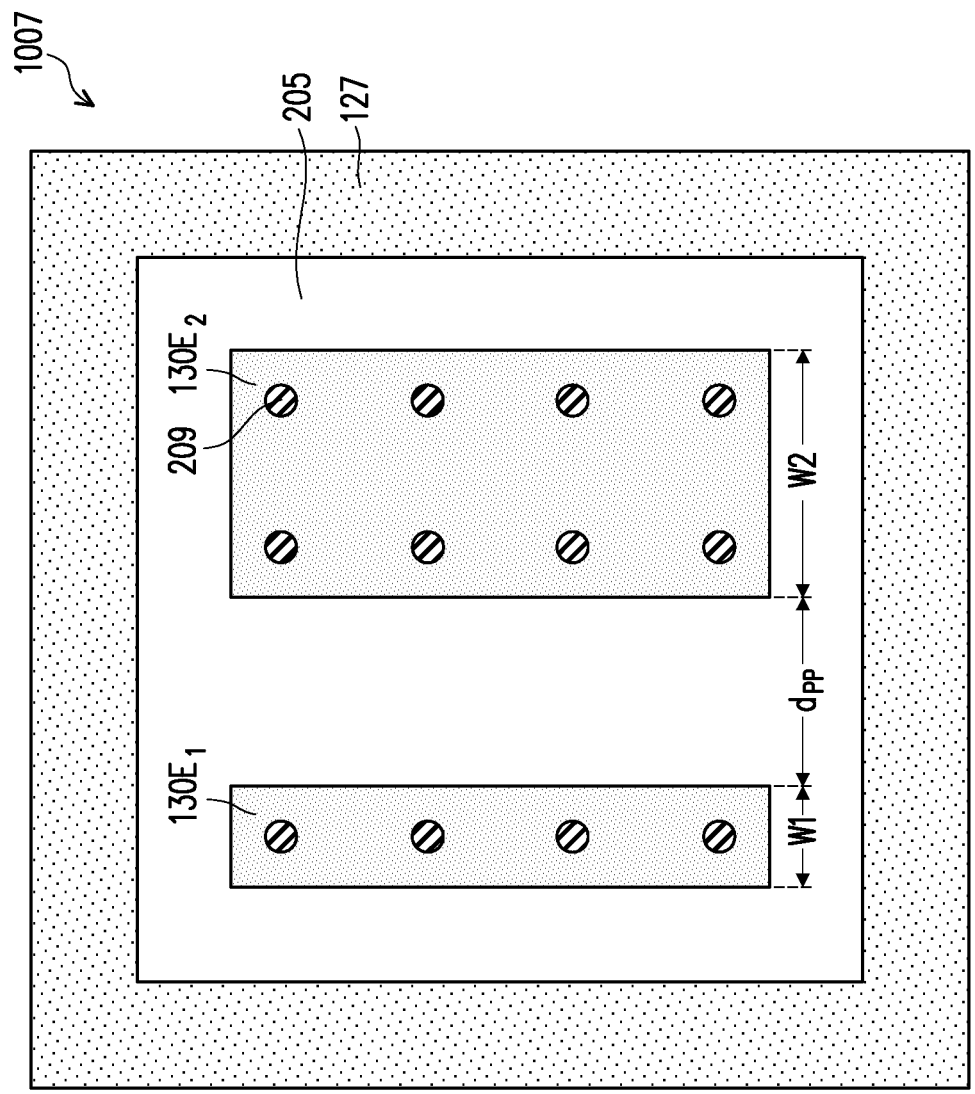

FIG. 7A and FIG. 7B are schematic various views illustrating 3DIC structures 1007 according to some embodiments of the disclosure. FIG. 7B shows a top view of a line II-II in FIG. 7A.

Referring to FIGS. 7A and 7B, the 3DIC structures 1007 is similar to the 3DIC structure 1006, wherein an isolation layer 130E of the 3DIC structure 1006 includes isolation parts $130E_1$ and $130E_2$ separated from each other. Each of the plurality of isolation parts $130E_1$ and $130E_2$ may have a structure such as those discussed above with reference to 130A, 130B, and/or 130C. The isolation parts $130E_1$ and $130E_2$ may surround different numbers of TSVs 209. Further, the isolation parts $130E_1$ and $130E_2$ may have different widths W1 and W2, different areas, or different shapes which is convenient for layout design. In some embodiments, the isolation part $130E_1$ surrounds one column TSVs 209, and the isolation part $130E_2$ surrounds two columns TSVs 209, and the width W1 of the isolation part $130E_1$ is less than the width W2 of the isolation part $130E_2$, but the disclosure is not limited thereto.

The 3DIC structure 1007 further includes a dummy terminal 143P disposed between conductive terminal 143 as shown in FIG. 7A. The dummy terminal 143P is floating disposed on the buffer layer 137, and does not penetrate into the buffer layer 137. The TSVs 209 are not disposed below the dummy terminal 143P and the isolation layer 130E does not extend below the dummy terminal 143P. In some embodiments, the distance $d_{pp}$ between the isolation parts P1 and P2 is greater than the width $W_{DT}$ of the dummy terminal 143P in some embodiments as shown in FIGS. 7A and 7B.

Figure 8A:
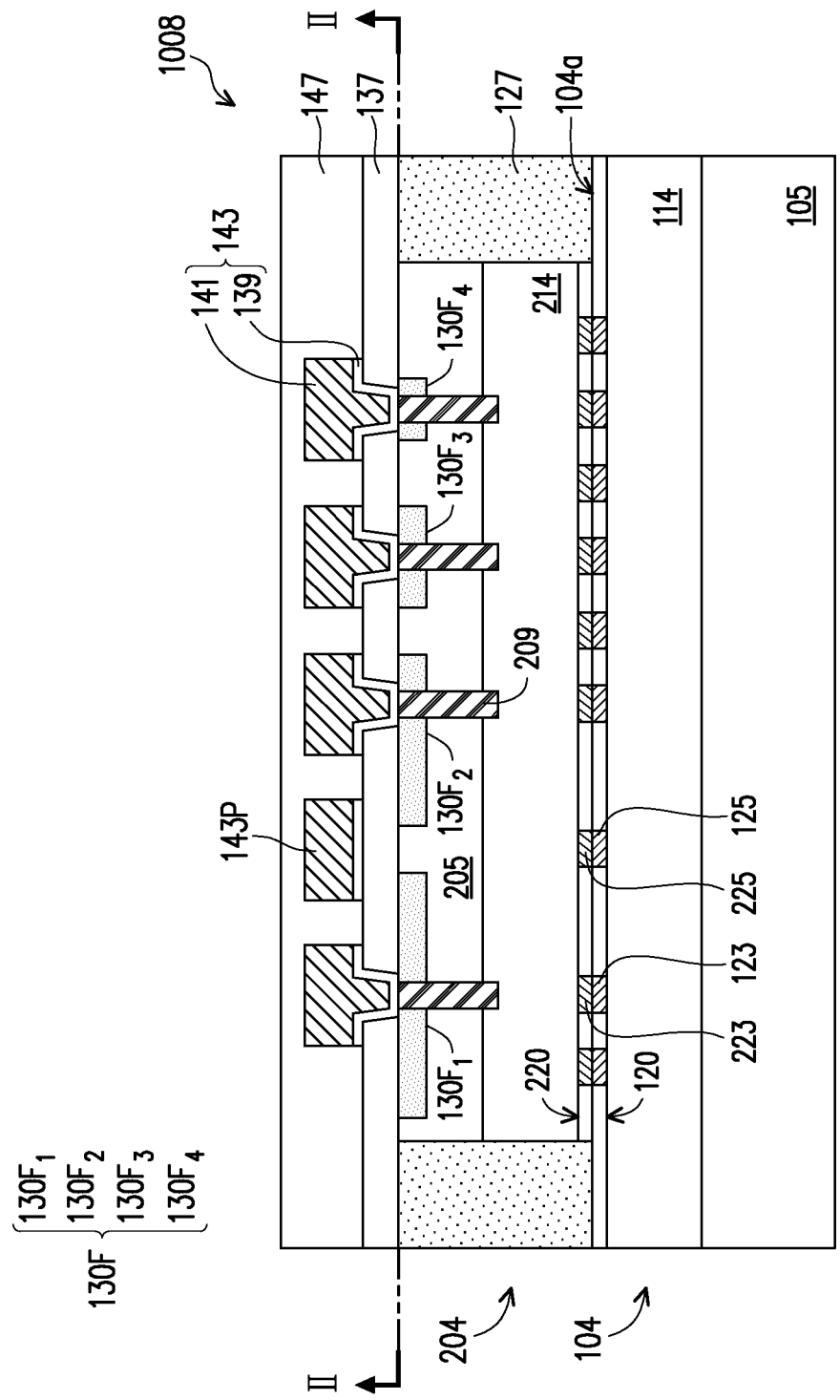
Figure 8B:
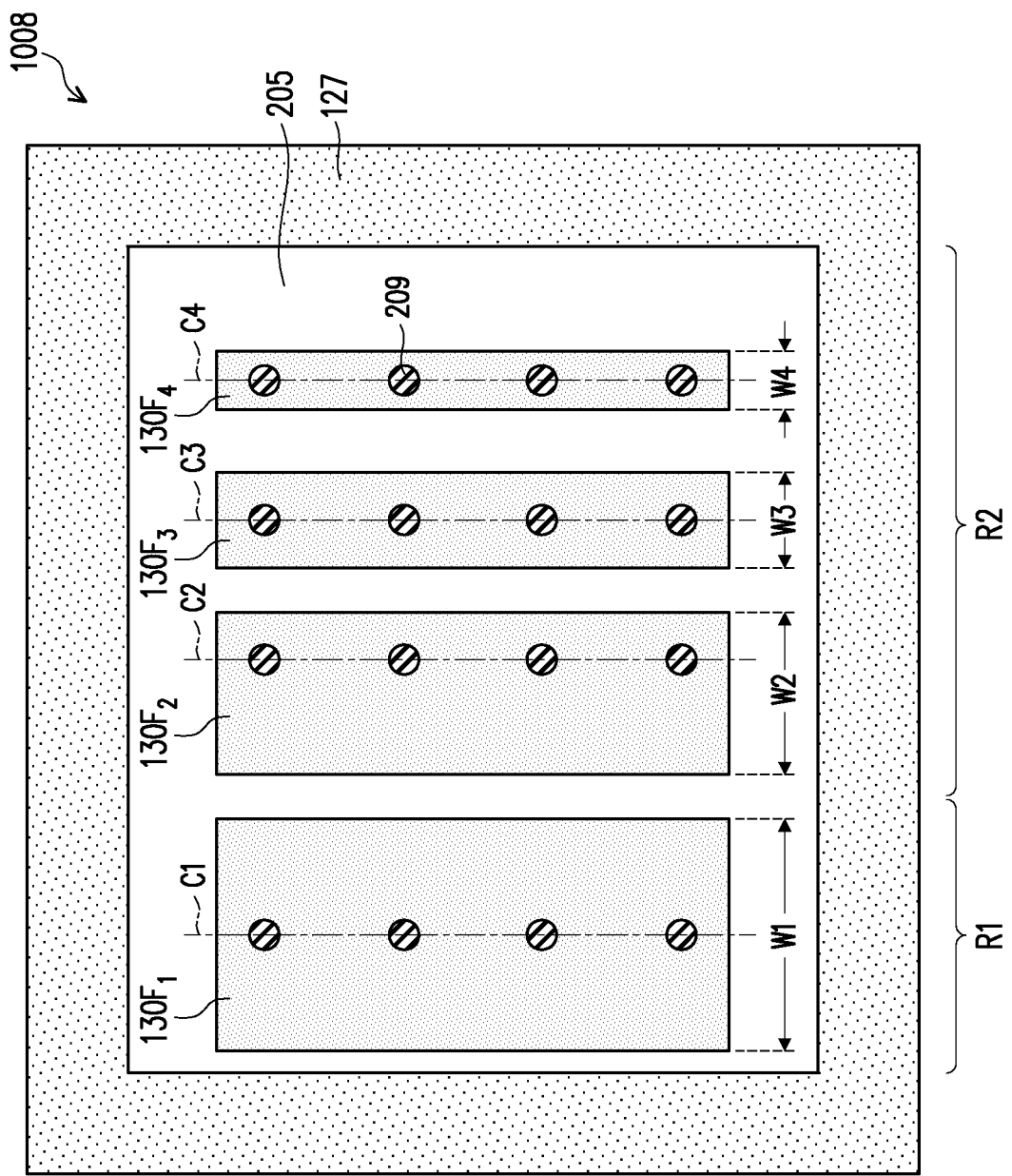

FIG. 8A to FIG. 8C are schematic various views illustrating 3DIC structures 1008 according to some embodiments of the disclosure. FIG. 8B and FIG. 8C show top views of a line II-II in FIG. 8A.

Referring to FIG. 8A to FIG. 8C, the 3DIC structures 1008 is similar to the 3DIC structure 1007, wherein an isolation layer 130F of the 3DIC structure 1009 includes isolation parts $130F_1$, $130F_2$, $130F_3$, and $130F_4$ separated from each other. Each of the plurality of isolation parts $130F_1$, $130F_2$, $130F_3$, and $130F_4$ may have a structure such as those discussed above with reference to 130A, 130B, and/or 130C.

The die 205 of the 3DIC structure 1008 includes a first region R1 and a second region R2. The density of the TSVs 209 in the first region R1 is lower than the density of the TSVs 209 in the second region R2. In some embodiments, for CMP uniformity, each of the isolation parts $130F_1$, $130F_2$, $130F_3$, and $130F_4$ is formed as a strip surrounding the same number of TSVs 209 as shown in FIG. 8B. In some embodiments, for CMP uniformity, each of the isolation parts $130F_1$, and $130F_2$ is formed as a rectangle surrounding two TSVs 209, and each of the isolation parts $130F_3$ and $130F_4$ is formed as a strip surrounding four TSVs 209 as shown in FIG. 8C. The isolation parts $130F_1$, $130F_2$, $130F_3$, and $130F_4$ may be formed to have different widths W1, W2, W3 and W4, and different areas, respectively. In some embodiments, the width W1 is greater than the width W2, the width W2 is greater than W3, the width W3 is greater than W4, but the disclosure is not limited thereto. In addition, the isolation parts $130F_1$ and $130F_2$ may extend below the dummy terminal 143P to further improve CMP uniformity. In some embodiments, the isolation parts $130F_1$, $130F_2$, and $130F_3$ are arranged to align with the center lines C1, C3 and C4 of the corresponding TSVs 209 respectively. The isolation part $130F_2$ is arranged to be offset from the center line C2 of the corresponding TSVs 209.

Figure 9A:
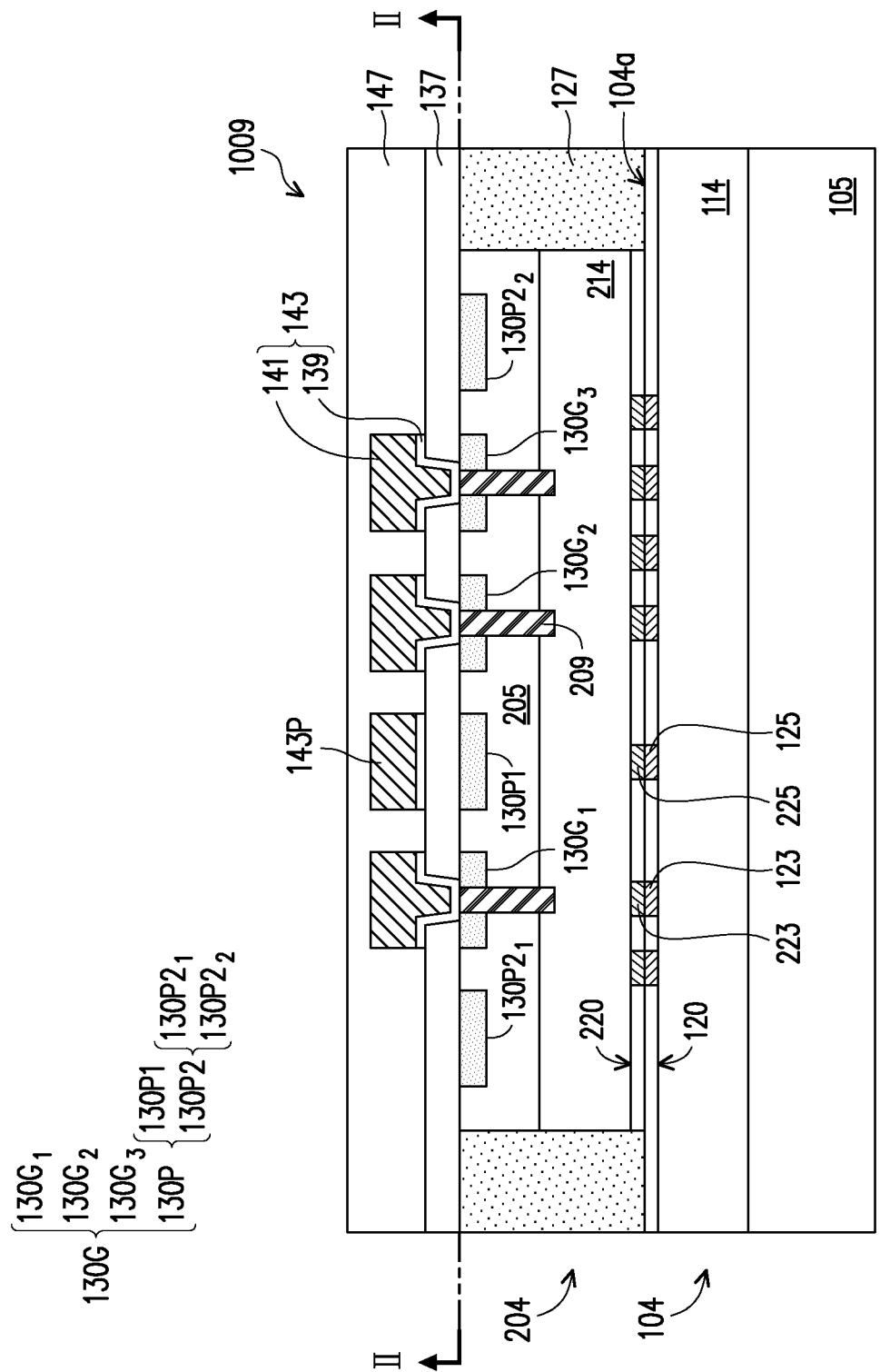
Figure 9B:
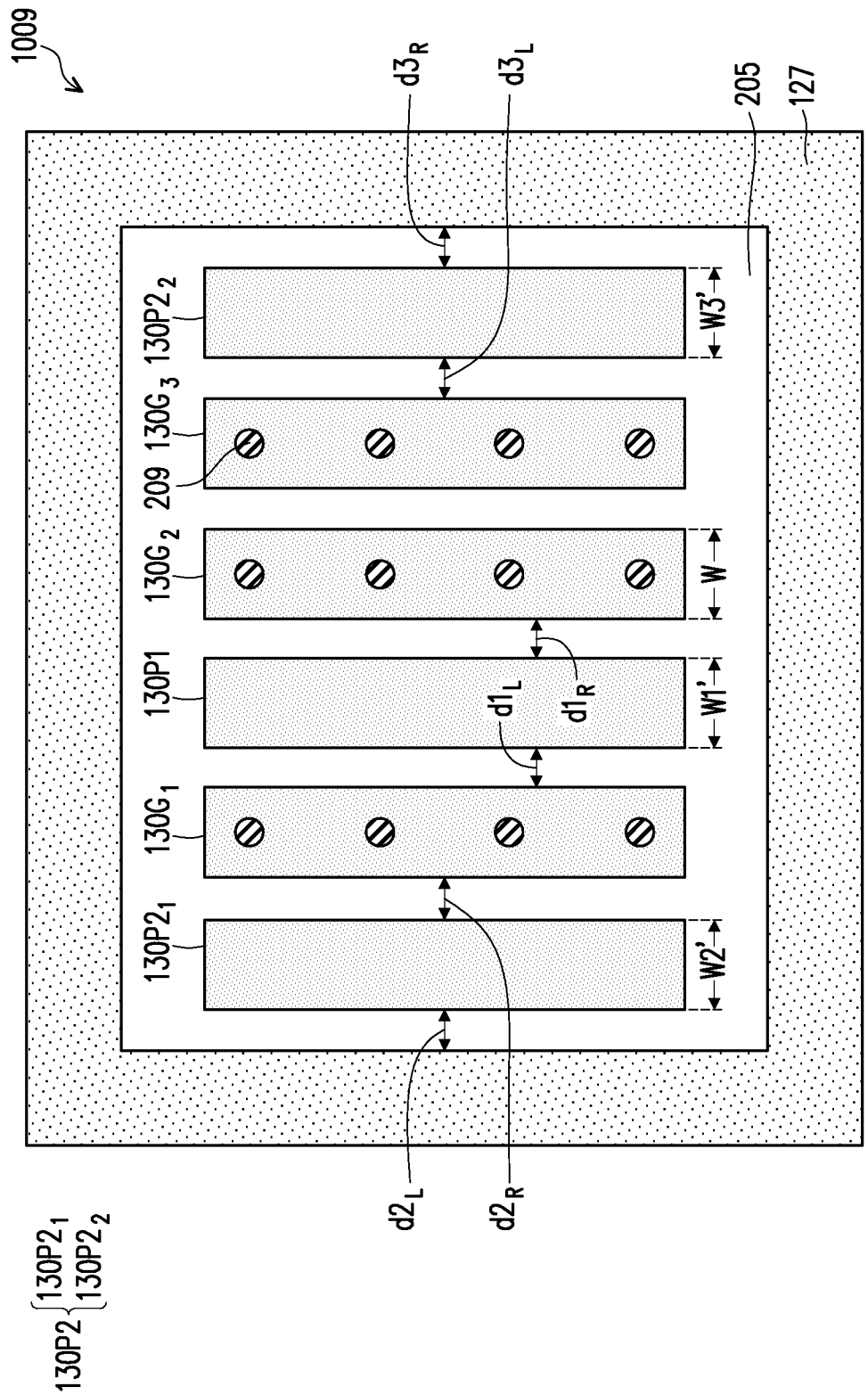
Figure 9C:
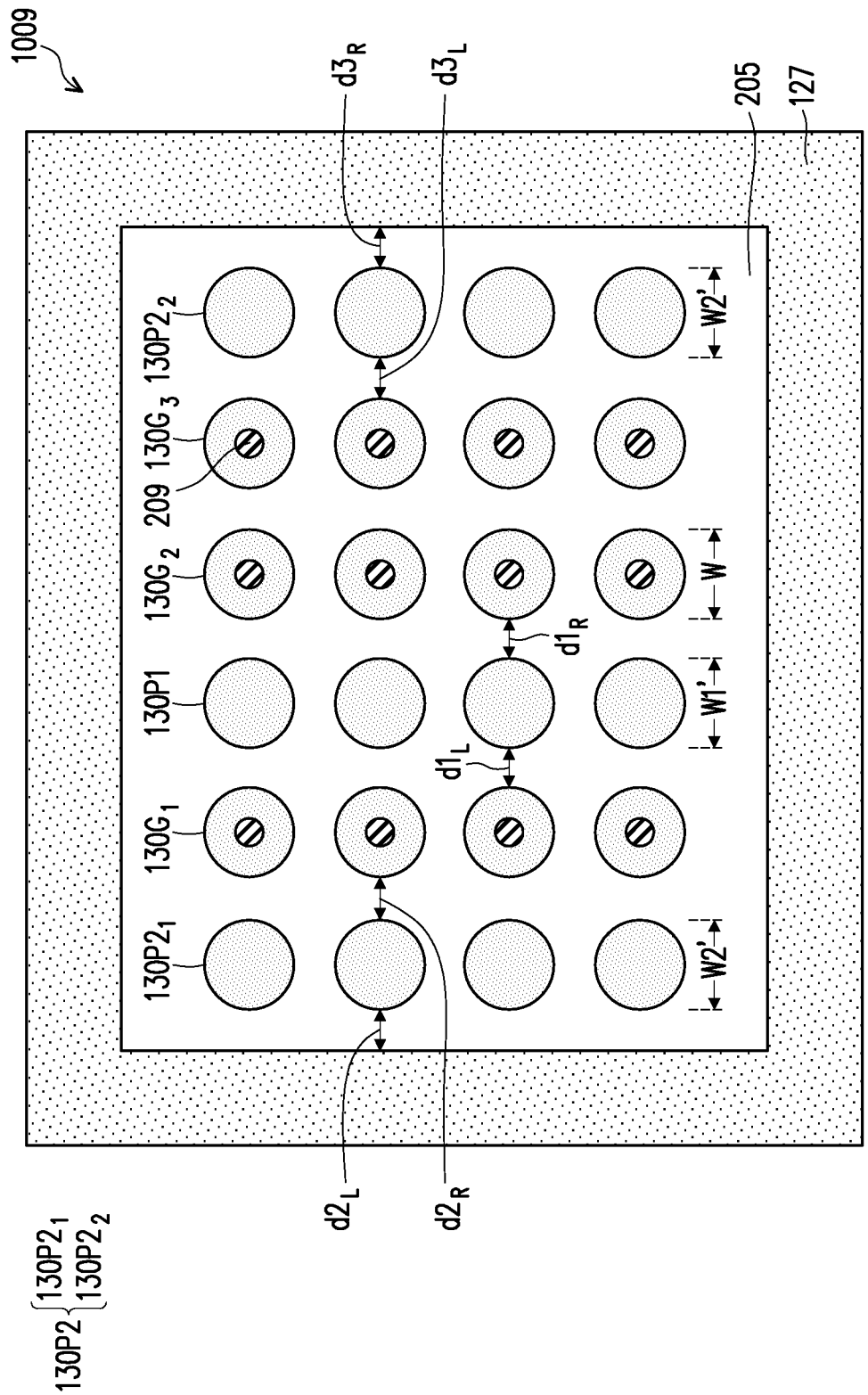

FIG. 9A to FIG. 9C are schematic various views illustrating 3DIC structures 1009 according to some embodiments of the disclosure. FIG. 9B and FIG. 9C show top views of a line II-II in FIG. 9A.

Referring to FIG. 9A to FIG. 9C, the 3DIC structures 1009 is similar to the 3DIC structure 1006, the difference is that an isolation layer 130G of the 3DIC structure 1009 includes isolation parts $130G_1$, $130G_2$, and $130G_3$ and dummy parts 130P separated from each other. Each of the isolation parts $130G_1$, $130G_2$, and $130G_3$ and dummy parts 130P may have a structure such as those discussed above with reference to 130A, 130B, and/or 130C. The isolation parts $130G_1$, $130G_2$, and $130G_3$ surround the same number of TSVs 209. The isolation parts $130G_1$, $130G_2$, and $130G_3$ have approximately the same width W, but the disclosure is not limited thereto. The dummy parts 130P includes dummy parts 130P1 and 130P2. The dummy parts 130P1 and 130P2 do not surround any TSV 209.

The dummy part 130P1 is disposed below the dummy terminal 143P, and laterally separated from the isolation parts $130G_1$, $130G_2$, and $130G_3$. The dummy parts 130P2 include a dummy part $130P2_1$ and dummy parts $130P2_2$. Each dummy part $130P2_1$ and $130P2_2$ is laterally separated from the isolation parts $130G_1$, $130G_2$, and $130G_3$ and the encapsulation 127. The dummy terminal 143P and the conductive terminals 143 are not provided on the dummy parts 130P2$_1$ and 130P2$_2$, and the TSVs 209 are not provided to penetrate through the dummy part 130P2.

The dummy parts 130P1, 130P2$_1$ and 130P2$_2$ may have the same shape or different shapes. The shape of the dummy parts 130P1, 130P2$_1$ and 130P2$_2$ may be the same as or different from the shape of the isolation parts 130G$_1$, 130G$_2$, and 130G$_3$. In some embodiments, the dummy parts 130P1, 130P2$_1$ and 130P2$_2$, and the isolation parts P are strips as shown in FIG. 9B. In some embodiments, the dummy parts 130P1, 130P2$_1$ and 130P2$_2$, and the isolation parts 130G$_1$, 130G$_2$, and 130G$_3$ are circles as shown in FIG. 9C. However, the embodiments of the present disclosure are not limited thereto, and the shapes of the dummy parts 130 P1, 130P2$_1$ and 130 P2$_2$, and the isolation parts 130G$_1$, 130G$_2$, and 130G$_3$ are not particularly limited, and can be adjusted and changed according to design.

The dummy parts 130P1, 130P2$_1$ and 130P2$_2$ have widths W1', W2' and W3', and the widths W1', W2' and W3' may be the same or different. Further, the widths W1', W2' and W3' may be the same as or different from the width W of the isolation parts 130G$_1$, 130G$_2$, and 130G$_3$. The distance d1$_L$ between the dummy parts 130P1 and the isolation part 130G$_1$ may be the same as or different from the distance d1$_R$ between the dummy parts 130P1 and the isolation part P2. The distance d2$_L$ between the dummy parts 130P2$_1$ and the encapsulation 127 may be the same as or different from the distance d2$_R$ between the dummy parts 130P2$_1$ and the isolation part 130G$_1$. The distance d3$_L$ between the dummy parts 130P2$_2$ and the isolation part 130G$_3$ may be the same as or different from the distance d3$_R$ between the dummy parts 130P2$_2$ and the encapsulation 127.

Figure 10:
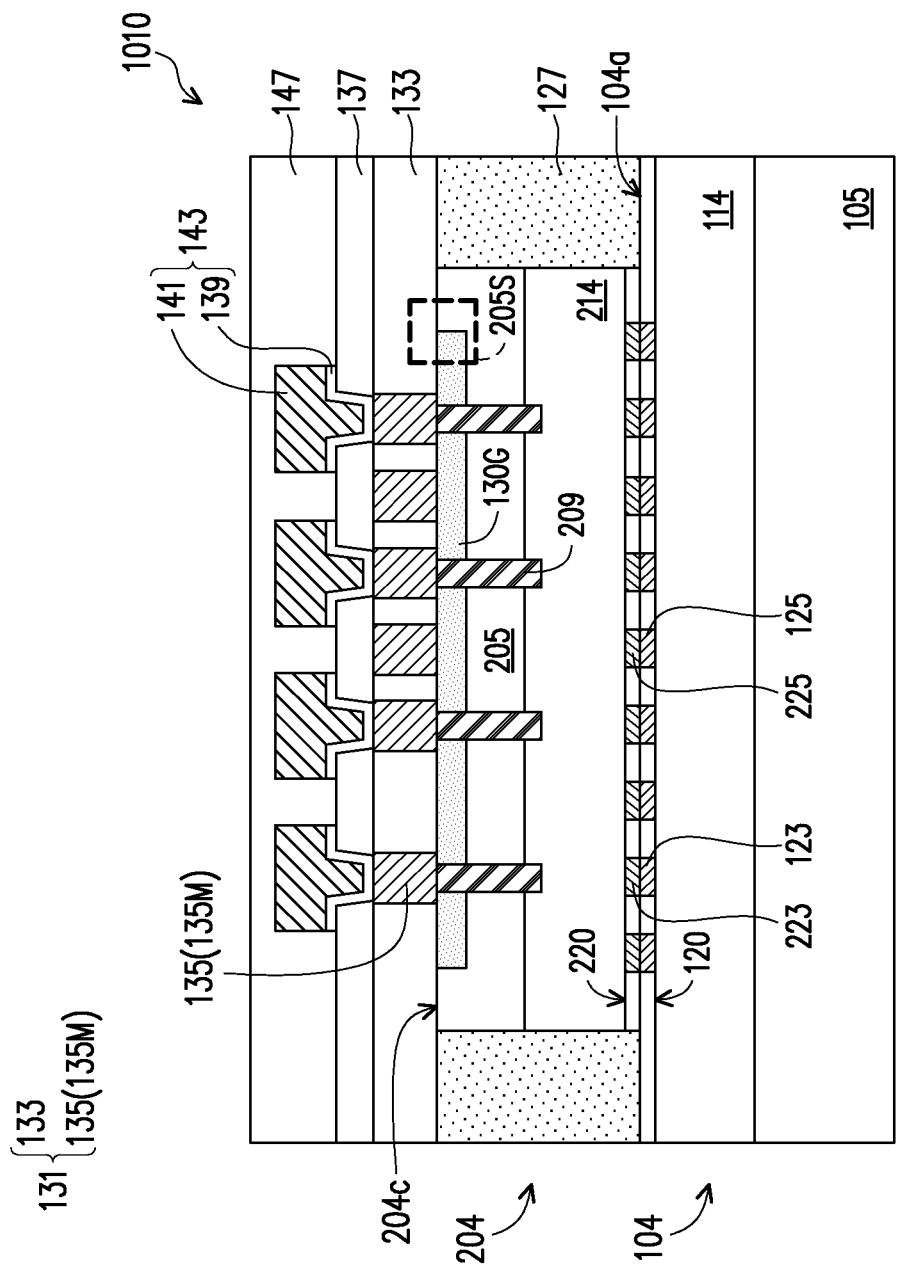
Figure 11:
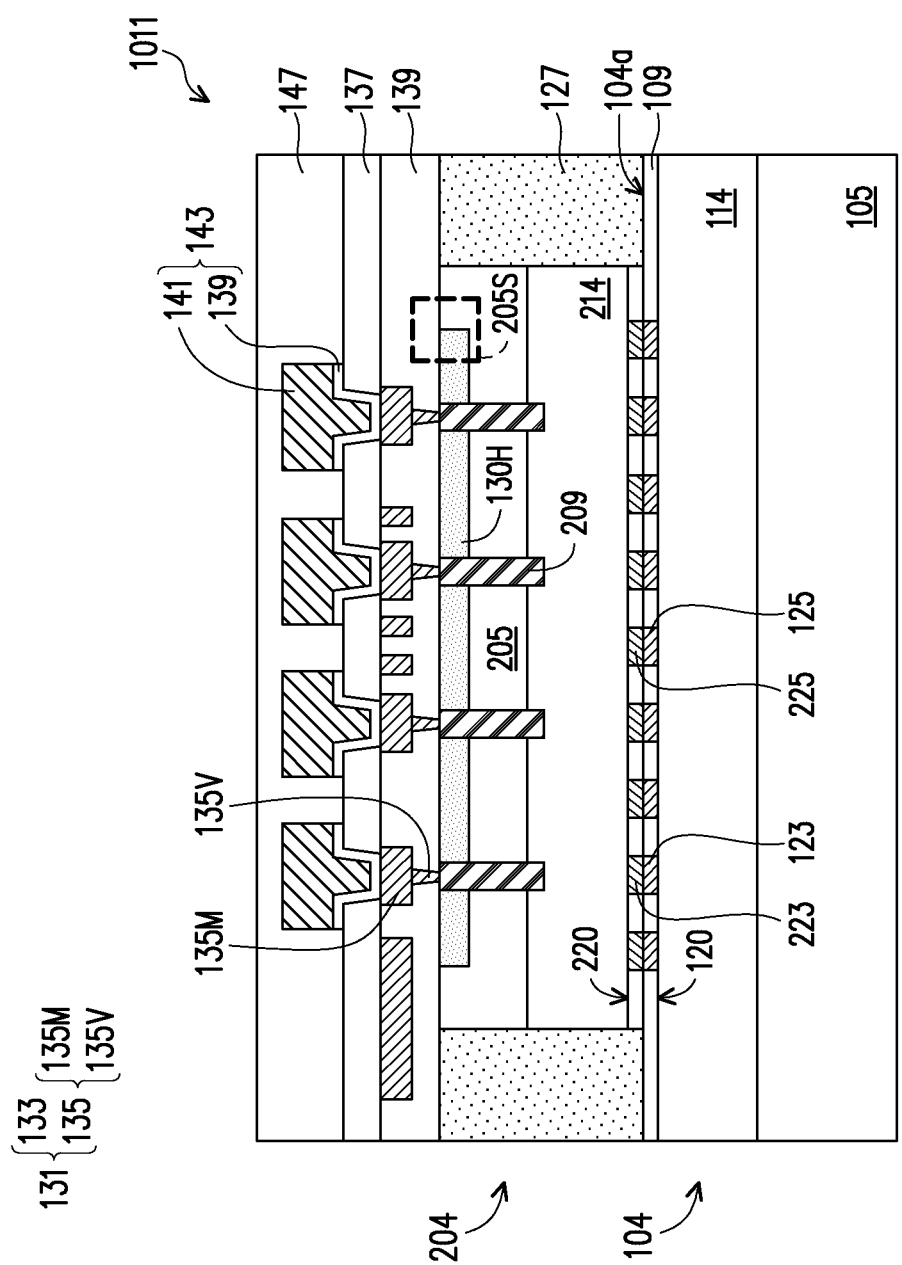

FIG. 10 to FIG. 12 are schematic cross-sectional views illustrating 3DIC structures 1010, 1011 and 1012 according to some embodiments of the disclosure.

Referring to FIG. 10 and FIG. 11, the 3DIC structures 1010 and 1011 are similar to the 3DIC structure 1002, wherein the 3DIC structures 1010 and 1011 each further includes a redistribution structure 131 formed over the backside surface 204c of the die 204 to electrically connect the TSVs 209 of the die 204 and/or to external devices. A 3DIC structure similar to the 3DIC structure 1002 discussed above is shown for illustrative purposes, and in some embodiments, other 3DIC structures such as those discussed above may be used. The redistribution structure 131 may include one or more dielectric layer(s) 133 and respective metallization pattern(s) 135 in the one or more dielectric layer(s) 133. The metallization patterns 135 are sometimes referred to as redistribution lines (RDLs). The dielectric layers 133 may include silicon oxide, silicon nitride, silicon carbide, silicon oxynitride, low-K dielectric material, such as PSG, BPSG, FSG, SiO$_x$C$_y$, Spin-On-Glass, Spin-On-Polymers, silicon carbon material, compounds thereof, composites thereof, combinations thereof, or the like. The dielectric layers 133 may be deposited by any suitable method, such as spinning, CVD, PECVD, HDP-CVD, or the like. The metallization patterns 135 include conductive lines 135M as shown in FIG. 10. In some embodiments, the metallization patterns 135 include conductive lines 135M and conductive vias CV as shown in FIG. 11. The sidewalls of the conductive vias 135V and the conductive lines 135M may be straight or inclined. In some embodiments, the conductive via V has inclined sidewall and is tapered toward the substrate 205.

The metallization patterns 135 may be formed in the dielectric layer 133, for example, by using photolithography techniques to deposit and pattern a photoresist material on the dielectric layer 133 to expose portions of the dielectric layer 133 that are to become the metallization pattern 135. An etch process, such as an anisotropic dry etch process, may be used to create recesses and/or openings in the dielectric layer 133 corresponding to the exposed portions of the dielectric layer 133. The recesses and/or openings may be lined with a diffusion barrier layer and filled with a conductive material. The diffusion barrier layer may include one or more layers of TaN, Ta, TiN, Ti, CoW, or the like, deposited by ALD, or the like, and the conductive material may include copper, aluminum, tungsten, silver, and combinations thereof, or the like, deposited by CVD, PVD, or the like. Any excessive diffusion barrier layer and/or conductive material on the dielectric layer may be removed, such as by using a CMP.

An isolation layer 130G of the 3DIC structures 1010 may be similar to isolation layer 130A, 130B, or 130C. An isolation layer 130H of the 3DIC structures 1011 may be similar to isolation layer 130A, 130B, 130C, 130D, 130E, or 130F.

In some embodiments, at least one Integrated Passive Device (IPD) (not shown) may also be disposed on the redistribution structure 131. The IPD may be fabricated using standard wafer fabrication technologies such as thin film and photolithography processing, and may be mounted on the redistribution structure 131 through, for example, flip-chip bonding or wire bonding, etc.

Referring to FIG. 12, the 3DIC structure 1012 is similar to the 3DIC structure 1002, 1003, 1004, 1006, 1007, 1008, 1009, 1010 or 1011, and an isolation layer 130I of the 3DIC structures 1012 may be similar to isolation layer 130A, 130B, 130C, 130D, 130E, or 130F. As shown in FIG. 12, the die 204 is bonded to a die 104' in a face-to-back configuration. That is, the front surface 204a of the die 204 faces the back surface 104b' of the die 104'. The die 104' is similar to the die 104, wherein the die 104' further includes TSVs 109' in the substrate 105' and a bonding structure 120' on the back surface 105b' of the substrate 105. The TSVs 109' is similar to the TSVs 209. In some embodiments, the TSVs 109' penetrate through the substrate 105' and are connected to an interconnection structure 114' formed on the front surface 105a' of the substrate 105'. In some embodiments, a liner 109j' and/or an adhesive layer 109i' may be formed before forming the TSVs 109', so that the TSVs 109' may be separated from the substrate 105'.

The bonding structure 120' is formed on the back surface 105b' of the substrate 105' and bonded with the bonding structure 220 of the die 204. The bonding structure 120' is similar to the bonding structure 120. In some embodiments, the bonding structure 120' may include bond pads 123' and dummy pads 125'. The bond pads 123' and dummy pads 125' may connect the bond pads 223 and the dummy pads 225 of the die 204 to the interconnection structure 114' of the die 104' as the 3DIC structure 1002. As shown in FIG. 12, the bond pads 123' of the bonding structure 120' are connected to the interconnection structure 114' through the TSVs 109'.

FIG. 13A through FIG. 13E illustrate cross-sectional views of forming a package, in accordance with some embodiments.

Figure 13A:
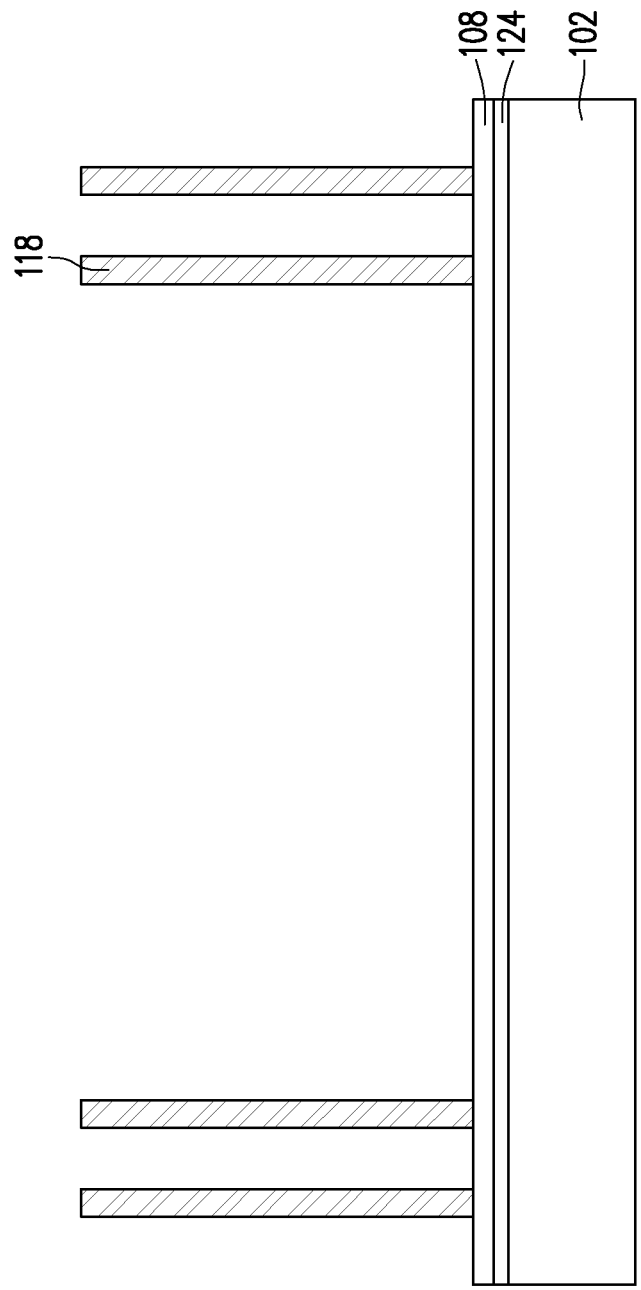
FIGS. 13A through 13E illustrate cross-sectional views of forming a package, in accordance with some embodiments.

Referring to FIG. 13A, a carrier substrate 102 is provided, and a release layer 124 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously. The release layer 124 may be formed of a polymer-based material, which may be removed along with the carrier substrate 102 from the overlying structures that will be formed in subsequent steps. In some embodiments, the release layer 124 is an epoxy-based thermal-release material, which loses its adhesive property when heated, such as a light-to-heat-conversion (LTHC) release coating. In some embodiments, the release layer 124 may be an ultra-violet (UV) glue, which loses its adhesive property when exposed to UV lights. The release layer 124 may be dispensed as a liquid and cured, may be a laminate film laminated onto the carrier substrate 102, or may be the like. The top surface of the release layer 124 may be leveled and may have a high degree of planarity.

A dielectric layer 108 is formed on the release layer 124. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

Referring to FIG. 13A, conductive pillars 118 are formed on the release layer 124. As an example to form the conductive pillars 118, a seed layer is formed over the release layer 124. In some embodiments, the seed layer is a metal layer, which may be a single layer or a composite layer comprising a plurality of sub-layers formed of different materials. For example, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pillars 118.

Figure 13B:
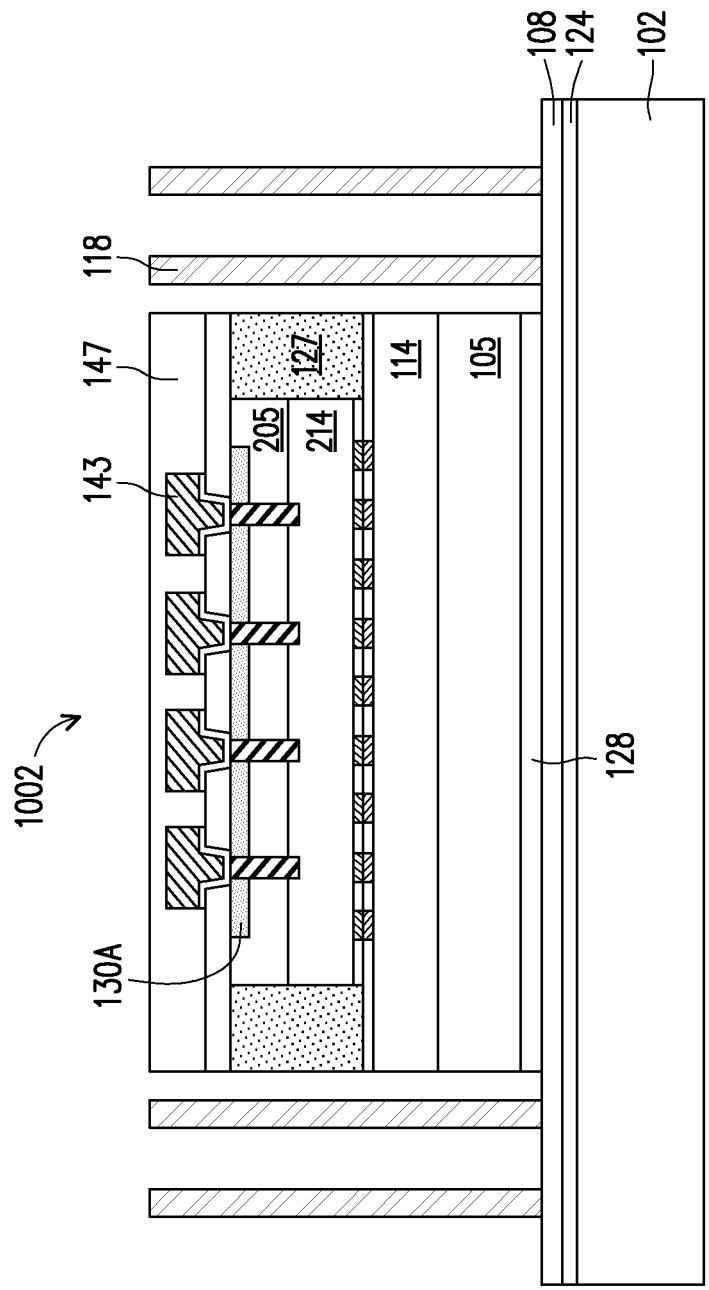

Referring to FIG. 13B, the 3DIC structures 1002 are adhered to the dielectric layer 108 by an adhesive 128. The 3DIC structures 1002 are shown for illustrative purposes, and in some embodiments, other 3DIC structures discussed above may be used. The adhesive 128 is on back-side surfaces of the 3DIC structures 1002 and adheres the 3DIC structures 1002 to the release layer 124. The adhesive 128 may be any suitable adhesive, epoxy, die attach film (DAF), or the like.

Figure 13C:
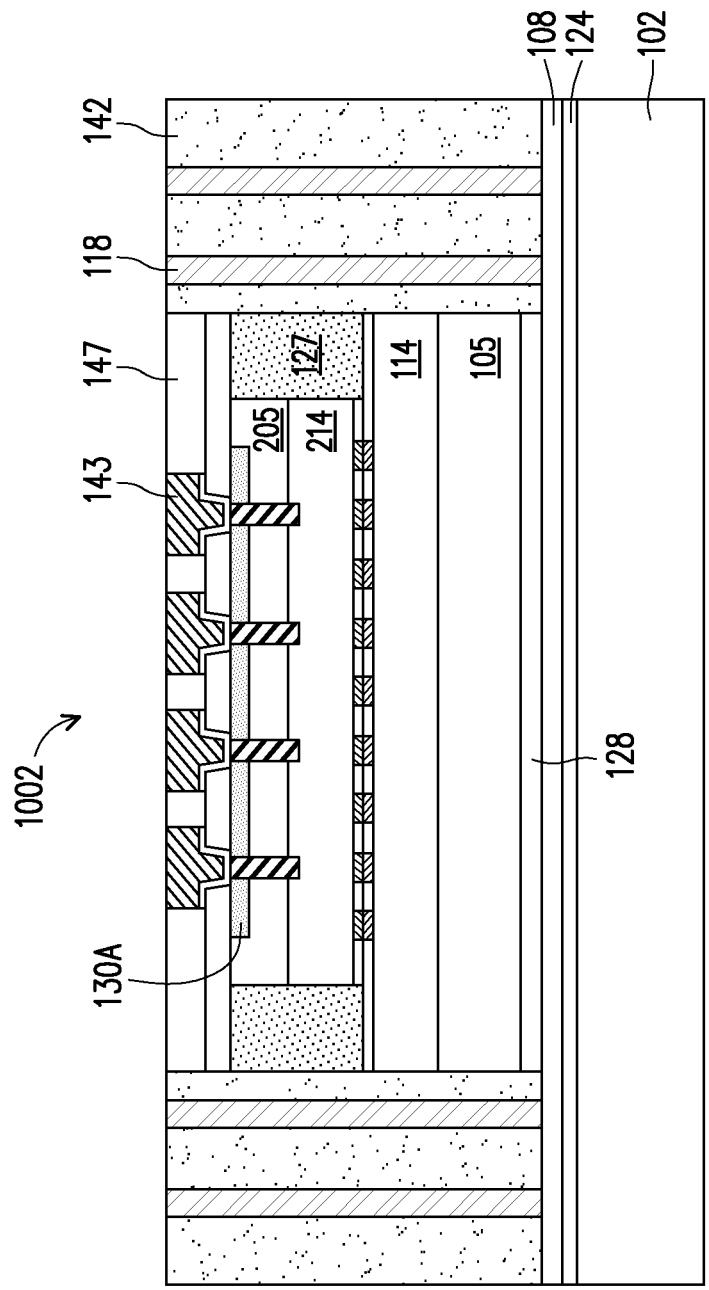

Referring to FIG. 13C, an encapsulant 142 is formed on the various components. After formation, the encapsulant 142 laterally encapsulates the conductive pillars 118 and 3DIC structures 1002. In some embodiments, the encapsulant 142 includes a molding compound, a molding underfill, a resin such as epoxy, a combination thereof, or the like. In some other embodiments, the encapsulant 142 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 142 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. The cross-section shape of the filler may be circle, oval, or any other shape. In some embodiments, the fillers include solid fillers, but the disclosure is not limited thereto. In some embodiments, a small portion of the fillers may be hollow fillers.

The encapsulant 142 may be applied by compression molding, transfer molding, spin-coating, lamination, deposition, or similar processes, and may be formed over the carrier substrate 102 such that the conductive pillars 118 and/or the 3DIC structures 1002 are buried or covered. The encapsulant 142 is then cured. The conductive pillars 118 penetrate the encapsulant 142, and the conductive pillars 118 are sometimes referred to as through vias 118 or through integrated fan-out vias (TIVs) 118.

Referring to FIG. 13C, a planarization process is then performed on the encapsulant 142 to remove a portion of the encapsulant 142, such that the top surfaces of the through vias 118 and the conductive terminals (die connectors) 143 are exposed. In some embodiments in which the top surfaces of the through vias 118 and the front-side surfaces of the 3DIC structures 1002 are not coplanar, portions of the through vias 118 or/and portions of the dielectric material 140 may also be removed by the planarization process. In some embodiments, top surfaces of the through vias 118, the conductive terminals 143, the insulating layer 147, and the encapsulant 142 are substantially coplanar after the planarization process. The planarization process may be, for example, a chemical-mechanical polish (CMP), a grinding process, or the like. In some embodiments, the planarization may be omitted, for example, if the through vias 118 and the conductive terminals 143 are already exposed.

Figure 13D:
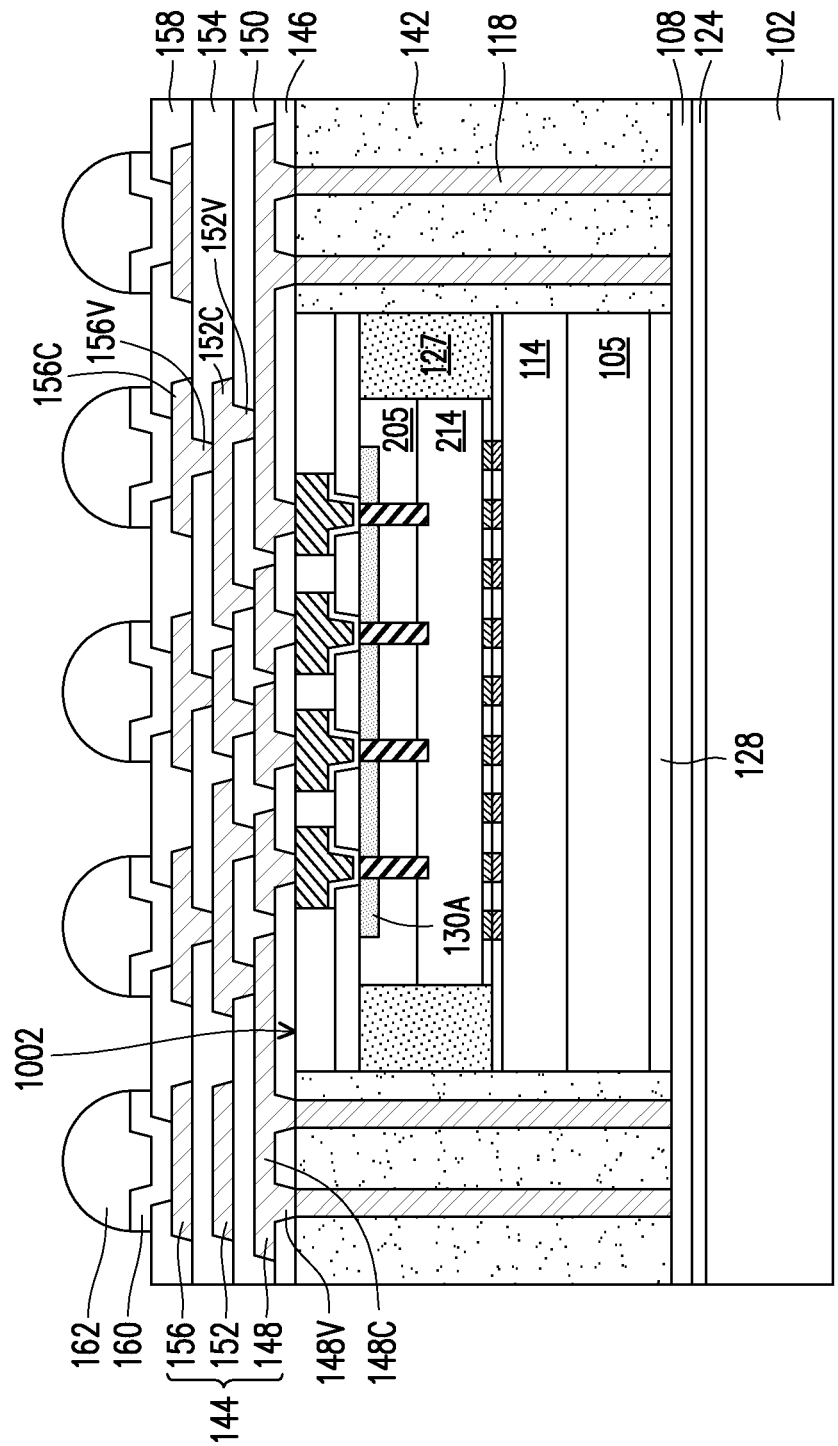

Referring to FIG. 13D, a front-side redistribution structure 144 is formed over front-side surfaces of the through vias 118, the encapsulant 142, and the 3DIC structures 1002. The front-side redistribution structure 144 includes dielectric layers 146, 150, 154, and 158; metallization patterns 148, 152, and 156; and under bump metallurgies (UBMs) 160. The metallization patterns 148, 152, and 156 may also be referred to as conductive redistribution layers or redistribution lines. The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

As an example to form the front-side redistribution structure 144, the dielectric layer 146 is deposited on the encapsulant 142, the through vias 118, and the conductive terminals 143. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms openings exposing portions of the through vias 118 and the conductive terminals 143. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 may be developed after the exposure.

The metallization pattern 148 is then formed. The metallization pattern 148 includes conductive lines CL on and extending along the top surface of the dielectric layer 146. The metallization pattern 148 further includes conductive vias V extending through the dielectric layer 146 to be physically and electrically connected to the through vias 118 and the 3DIC structures 1002. The sidewalls of the conductive vias 148V and the conductive lines 148C may be straight or inclined. In some embodiments, the conductive via V has inclined sidewall and is tapered toward the 3DIC structures 1002. To form the metallization pattern 148, a seed layer is formed over the dielectric layer 146 and in the openings extending through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 148. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 148. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layers 150, 154, 158, and the metallization patterns 152, 156 are formed alternately. The dielectric layer 150, 154, and 158 may be formed in a manner similar to the dielectric layer 146, and may be formed of the same material as the dielectric layer 146. The metallization patterns 152 and 156 may include conductive lines 152C and 156C on the underlying dielectric layer and conductive vias 152V and 156V extending through the underlying dielectric layer respectively. The metallization patterns 152 and 156 may be formed in a manner similar to the metallization pattern 148, and may be formed of the same material as the metallization pattern 148. The UBMs 160 are optionally formed on and extending through the dielectric layer 158. The UBMs 160 may be formed in a manner similar to the metallization pattern 148, and may be formed of the same material as the metallization pattern 148.

Referring to FIG. 13D, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 162 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In another embodiment, the conductive connectors 162 may include a conductive material such as solder, copper, aluminum, gold, nickel, silver, palladium, tin, the like, or a combination thereof. In some embodiments, the conductive connectors 162 are formed by initially forming a layer of solder through such commonly used methods such as evaporation, electroplating, printing, solder transfer, ball placement, or the like. Once a layer of solder has been formed on the structure, a reflow process may be performed in order to shape the material into the desired bump shapes.

Figure 13E:
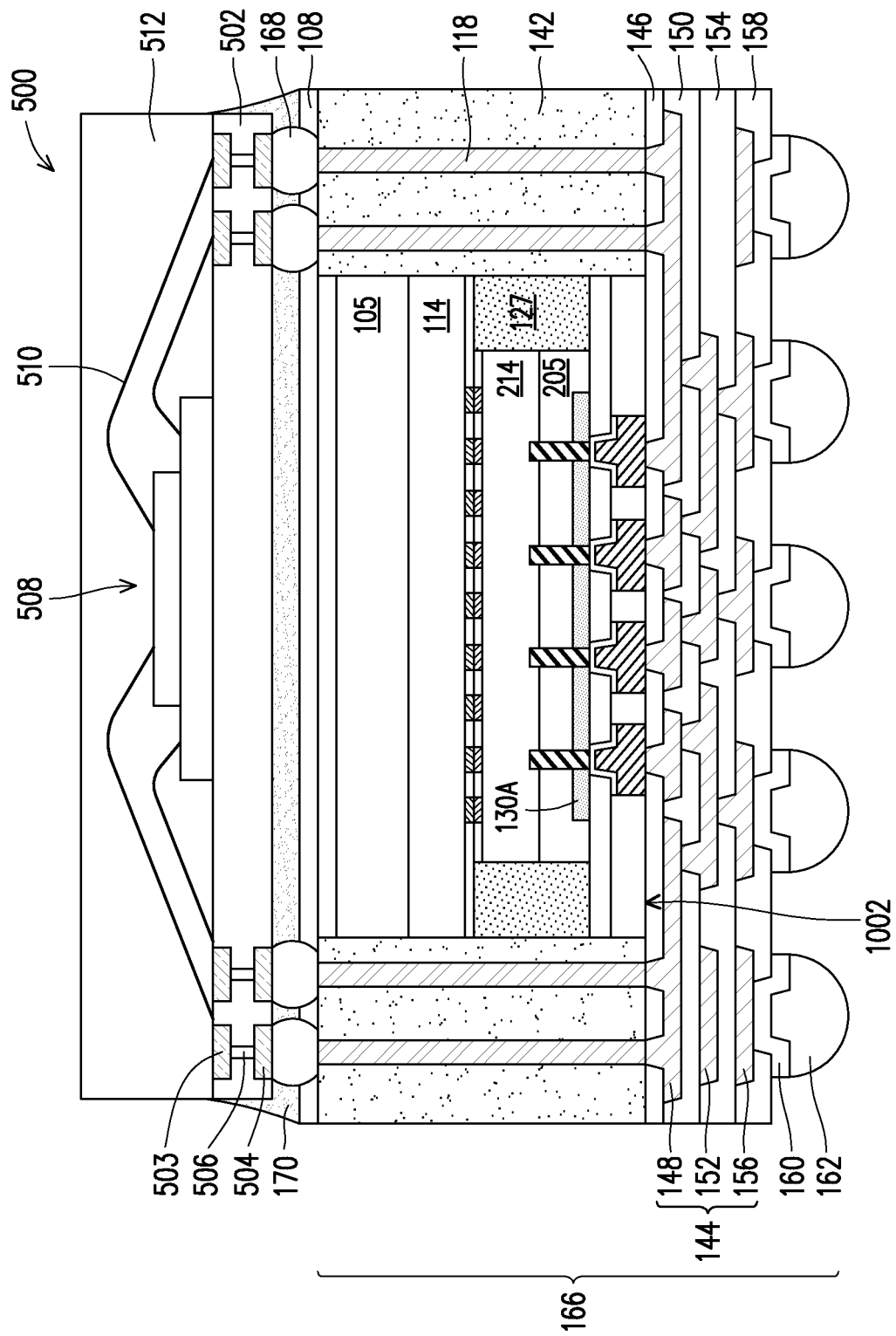

Referring to FIGS. 13D and 13E, a carrier substrate de-bonding is performed to detach (or "de-bond") the carrier substrate 102 from the dielectric layer 108 to form a package 166. In accordance with some embodiments, the de-bonding includes projecting a light such as a laser light or an UV light on the release layer 124 so that the release layer 124 decomposes under the heat of the light and the carrier substrate 102 may be removed. The package 166 is then flipped over and placed on a tape (not shown).

Referring to FIG. 13E, a top package 500 may be bonded to package 166. The top package 500 includes a substrate 502 and one or more stacked dies (or dies) 508 coupled to the substrate 502. The substrate 502 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 502 may be a SOI substrate. Generally, an SOI substrate includes a layer of a semiconductor material such as epitaxial silicon, germanium, silicon germanium, SOI, silicon germanium on insulator (SGOI), or combinations thereof. The substrate 502 is, in some embodiments, based on an insulating core such as a fiberglass reinforced resin core. One example core material is fiberglass resin such as FR4. Other materials that may be used for the core material include bismaleimide-triazine (BT) resin, or alternatively, other printed circuit board (PCB) materials or films. Build up films such as Ajinomoto build-up film (ABF) or other laminates may be used for substrate 502.

The substrate 502 may include active and passive devices (not shown). As one of ordinary skill in the art will recognize, a wide variety of devices such as transistors, capacitors, resistors, combinations of these, and the like may be used to generate the structural and functional requirements of the design for the top package 500. The devices may be formed using any suitable methods.

The substrate 502 may also include metallization layers (not shown) and through vias 506. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 502 is substantially free of active and passive devices.

The substrate 502 may have bond pads 503 on a first side the substrate 502 to couple to the stacked dies 508, and bond pads 504 on a second side of the substrate 502, the second side being opposite the first side of the substrate 502, to couple to the conductive connectors 168. In some embodiments, the bond pads 503 and 504 are formed by forming recesses (not shown) into dielectric layers (not shown) on the first and second sides of the substrate 502. The recesses may be formed to allow the bond pads 503 and 504 to be embedded into the dielectric layers. In other embodiments, the recesses are omitted as the bond pads 503 and 504 may be formed on the dielectric layer. In some embodiments, the bond pads 503 and 504 include a thin seed layer (not shown) made of copper, titanium, nickel, gold, palladium, the like, or a combination thereof. The conductive material of the bond pads 503 and 504 may be deposited over the thin seed layer. The conductive material may be formed by an electro-chemical plating process, an electroless plating process, CVD, ALD, PVD, the like, or a combination thereof. In an embodiment, the conductive material of the bond pads 503 and 504 is copper, tungsten, aluminum, silver, gold, the like, or a combination thereof. In some embodiments, the bond pads 503 and 504 are UBMs that are formed using the same or similar processes as described earlier in connection with UBMs 160.

In the illustrated embodiment, the stacked dies 508 are coupled to the substrate 502 by wire bonds 510, although other connections may be used, such as conductive bumps. In some embodiments, the stacked dies 508 are stacked memory dies. For example, the stacked memory dies 508 may include low-power (LP) double data rate (DDR) memory modules, such as LPDDR1, LPDDR2, LPDDR3, LPDDR4, or the like memory modules.

In some embodiments, the stacked dies 508 and the wire bonds 510 may be encapsulated by a molding material 512. The molding material 512 may be molded on the stacked dies 508 and the wire bonds 510, for example, using compression molding. In some embodiments, the molding material 512 is a molding compound, a polymer, an epoxy, silicon oxide filler material, the like, or a combination thereof. A curing step may be performed to cure the molding material 512, wherein the curing may be a thermal curing, a UV curing, the like, or a combination thereof.

In some embodiments, the stacked dies 508 and the wire bonds 510 are buried in the molding material 512, and after the curing of the molding material 512, a planarization step, such as a grinding, is performed to remove excess portions of the molding material 512 and provide a substantially planar surface for the top packages 500.

After the top packages 500 are formed, the top packages 500 are bonded to the InFO packages 166 by way of the conductive connectors 168 and the bond pads 504. In some embodiments, the stacked memory dies 508 may be coupled to the 3DIC structure 1002 through the wire bonds 510, the bond pads 503 and 504, through vias 506, the conductive connectors 168, and the through vias 118.

The conductive connectors 168 may be similar to the conductive connectors 162 described above and the description is not repeated herein, although the conductive connectors 168 and 162 need not be the same. In some embodiments, before bonding the conductive connectors 168, the conductive connectors 168 are coated with a flux (not shown), such as a no-clean flux. The conductive connectors 168 may be dipped in the flux or the flux may be jetted onto the conductive connectors 168.

In some embodiments, the conductive connectors 168 may have an epoxy flux (not shown) formed thereon before they are reflowed with at least some of the epoxy portion of the epoxy flux remaining after the top package 500 is attached to the package 166. This remaining epoxy portion may act as an underfill to reduce stress and protect the joints resulting from the reflowing the conductive connectors 168. In some embodiments, an underfill 170 may be formed between the top package 500 and the package 166 and surrounding the conductive connectors 168. The underfill 170 may be formed by a capillary flow process after the top package 500 is attached or may be formed by a suitable deposition method before the top package 500 is attached.

The bonding between the top package 500 and the package 166 may be a solder bonding or a direct metal-to-metal (such as a copper-to-copper or tin-to-tin) bonding. In an embodiment, the top package 500 is bonded to the package 166 by a reflow process. During this reflow process, the conductive connectors 168 are in contact with the bond pads 504 and the through vias 118 to physically and electrically couple the top package 500 to the package 166.

Based on the above discussions, it can be seen that the present disclosure offers various advantages. It is understood, however, that not all advantages are necessarily discussed herein, and other embodiments may offer different advantages, and that no particular advantage is required for all embodiments. In some embodiments, the top surface of the encapsulation and the top surface of the portion of the substrate are covered by the mask layer to prevent/reduce etching of the encapsulation, and not exposed by the recess during the etching process. Therefore, the top surface of the encapsulation may be protected from pit defects and chamber contamination may be reduced during the TSVs is revealed.

Various embodiments were discussed above. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a package comprises a first die, wherein the first die comprises a plurality of through vias from a first surface of the first die toward a second surface of the first die; a second die disposed below the first die, wherein the second surface of the first die is bonded to the second die; an isolation layer disposed in the first die, wherein the plurality of through vias extend through the isolation layer; an encapsulation laterally surrounding the first die, wherein the encapsulation is laterally separated from the isolation layer; a buffer layer disposed over the first die, the isolation layer, and the encapsulation; and a plurality of conductive terminals disposed over the isolation layer, wherein the plurality of conductive terminals is electrically connected to corresponding ones of the plurality of through vias. In an embodiment, the isolation layer comprises a bulk layer surrounding the plurality of through vias in the first die. In an embodiment, the isolation layer comprises a plurality of isolation parts, wherein each isolation part of the plurality of isolation parts surround at least one through via of the plurality of through vias. In an embodiment, each isolation part of the plurality of isolation parts surrounds a same number of the plurality of through vias. In an embodiment, the plurality of isolation parts comprises a first isolation part and a second isolation part, wherein the first isolation part surrounds a first number of through vias of the plurality of through vias, wherein the second isolation part surrounds a second number of through vias of the plurality of through vias, wherein the first number is different than the second number. In an embodiment, each isolation part of the plurality of isolation parts has a same width. In an embodiment, the plurality of isolation parts comprises a first isolation part and a second isolation part, wherein the first isolation part has a first width, wherein the second isolation part has a second width, wherein the first width is different than the second width. In an embodiment, the isolation layer comprises a dummy isolation part separated from the plurality of isolation parts, the dummy isolation part being disposed between adjacent ones of the plurality of isolation parts, and wherein no through via of the plurality of through vias penetrate the dummy isolation part. In an embodiment, the isolation layer comprises a dummy isolation part separate from the plurality of isolation parts, the dummy isolation part being disposed between a first isolation part of the plurality of isolation parts and the encapsulation, wherein the first isolation part is an isolation part closest to an edge of the first die, and wherein no through via of the plurality of through vias penetrate the dummy isolation part.

In an embodiment, a package comprises a first die, wherein the first die comprises first substrate, the first die further comprising a first through via and a second through via extending from a top surface of the first substrate toward a bottom surface of the first die; an isolation layer disposed in a recess in the top surface of the first substrate, the isolation layer surrounding the first through via and the second through via, wherein the first substrate surrounds the isolation layer in a top view; and a first encapsulation laterally surrounding the first die, wherein the first substrate is interposed between the first isolation layer and the first encapsulation. In an embodiment, the top surface of the first substrate is level with a top surface of the first encapsulation and a top surface of the isolation layer. In an embodiment, the package further comprises a buffer layer disposed over the first encapsulation, the first die and the isolation layer, wherein a bottom surface of the buffer layer is in contact with the top surfaces of the first encapsulation, the first die and the isolation layer. In an embodiment, the package further comprises a dummy terminal over the buffer layer, wherein the isolation layer extends below the dummy terminal. In an embodiment, the package further comprises a dummy terminal over the buffer layer, wherein the isolation layer does not extend below the dummy terminal. In an embodiment, the isolation layer comprises multiple layers.

In an embodiment, a method of manufacturing a package structure comprises bonding a first surface of a first die to a second die, wherein the first die comprises a first through via; forming an encapsulation laterally aside the first die; forming a first recess in a second surface of the first die, the first recess extending around the first through via; and forming an isolation layer in the first recess, wherein the isolation layer is separated from the encapsulation by the first die. In an embodiment, the first die comprises a second through via, wherein the first recess extends continuously around the first through via and the second through via. In an embodiment, the first die comprises a second through via, further comprising forming a second recess surrounding the second through via, wherein forming the isolation layer comprises forming a first isolation part in the first recess and forming a second isolation part in the second recess, wherein the first isolation part is separated from the second isolation part. In an embodiment, the method further comprises forming a second recess, wherein the second recess does not expose a conductive feature; and forming the isolation layer in the second recess. In an embodiment, the method further comprises forming a buffer layer on the encapsulation, the isolation layer, the plurality of through vias, and the first die; and forming a conductive terminal on the buffer layer, wherein the conductive terminal is electrically connected to the first through via.

What is claimed is:

1. A method of manufacturing a package structure, the method comprising:
    bonding a first surface of a first die to a second die, wherein the first die comprises a first through via;
    forming an encapsulation laterally aside the first die;
    forming a first patterned mask over a second surface of the first die, the first patterned mask having an opening exposing a portion of the second surface of the first die;
    forming a first recess in a second surface of the first die through the opening in the first patterned mask, the first recess extending around the first through via; and
    forming an isolation layer in the first recess, wherein the isolation layer is separated from the encapsulation by the first die.

2. The method of claim 1, wherein the first die comprises a second through via, wherein the first recess extends continuously around the first through via and the second through via.

3. The method of claim 1, wherein the first die comprises a second through via, further comprising forming a second recess surrounding the second through via, wherein forming the isolation layer comprises forming a first isolation part in the first recess and forming a second isolation part in the second recess, wherein the first isolation part is separated from the second isolation part.

4. The method of claim 1, further comprising:
    forming a second recess in a second surface of the first die, wherein the second recess does not expose a conductive feature; and
    forming the isolation layer in the second recess.

5. The method of claim 3, further comprising:
    forming a buffer layer on the encapsulation, the isolation layer, the plurality of through vias, and the first die; and
    forming a conductive terminal on the buffer layer, wherein the conductive terminal is electrically connected to the first through via.

6. The method of claim 4, wherein a width of the second recess is different than a width of the first recess.

7. The method of claim 1, wherein a first surface of the isolation layer is level with the first surface of the first die.

8. The method of claim 1, wherein forming the isolation layer comprises:
    forming a first isolation sub-layer in the first recess; and forming a second isolation sub-layer over the first isolation sub-layer.

9. The method of claim 8, wherein a surface of the second isolation sub-layer is level with the first surface of the first die.

10. A method of manufacturing a package structure, the method comprising:
   attaching a first surface of a first die to a substrate, wherein the first die comprises a first through via in a first semiconductor substrate;
   forming an encapsulation over the substrate, wherein the encapsulation extends along sidewalls of the first die;
   after forming the encapsulation, thinning the first semiconductor substrate to expose the first through via;
   after thinning the first semiconductor substrate, forming a first recess in a second surface of the first die, the first recess extending around the first through via; and
   forming a first isolation structure in the first recess, wherein the first surface of the first die, a surface of the first isolation structure, and a surface of the encapsulation are coplanar.

11. The method of claim 10, wherein forming the first isolation structure comprises:
   forming a first isolation sub-layer in the first recess and over the encapsulation;
   forming a second isolation sub-layer over the first isolation sub-layer; and
   removing portions of the first isolation sub-layer over the encapsulation.

12. The method of claim 11, wherein the first die comprises a second through via and a third through via, further comprising:
   forming a second recess in the second surface of the first die, wherein the second recess extends around the second through via; and
   forming a second isolation structure in the second recess, wherein the second isolation structure is spaced apart from the first isolation structure.

13. The method of claim 12, wherein the second recess extends around the third through via.

14. The method of claim 12, further comprising:
   forming a third recess in the second surface of the first die, wherein the third recess is spaced apart from the first recess and the second recess, wherein the third recess is free of through vias.

15. The method of claim 14, wherein the third recess is between the first recess and the second recess.

16. A method of manufacturing a package structure, the method comprising:
   attaching a first surface of a first die to a substrate, wherein the first die comprises a first semiconductor substrate and a first through via in the first semiconductor substrate;
   forming an encapsulation over the substrate, wherein the encapsulation extends along sidewalls of the first die;
   forming a first recess in a second surface of the first die, the first recess exposing a surface of the first semiconductor substrate, the first recess extending around the first through via in a plan view;
   forming a first isolation structure in the first recess, wherein the first surface of the first die, a surface of the first isolation structure, and a surface of the encapsulation are coplanar;
   forming a buffer layer on the encapsulation and the first isolation structure; and
   forming a conductive terminal on the buffer layer, wherein the conductive terminal is electrically connected to the first through via;
   forming a first redistribution structure over the buffer layer and the conductive terminal; and
   forming a conductive connector on the first redistribution structure, wherein the conductive connector is electrically connected to the first through via through the first redistribution structure.

17. The method of claim 16, wherein forming the first isolation structure comprises:
   forming a first isolation sub-layer in the first recess; and
   forming a second isolation sub-layer over the first isolation sub-layer in the first recess.

18. The method of claim 17, wherein the conductive terminal directly contacts the first isolation sub-layer and the second isolation sub-layer.

19. The method of claim 16, further comprising:
   forming a second recess and a third recess in the second surface of the first die, wherein surfaces of the second recess and the third recess are free of conductive material; and
   forming a second isolation structure in the second recess and a third isolation structure in the third recess, wherein the second isolation structure and the third isolation structure are separated from the first isolation structure.

20. The method of claim 19, wherein the first isolation structure is between the second isolation structure and the third isolation structure.

* * * * *